(12) United States Patent
Cheng et al.

(10) Patent No.: US 12,154,850 B2
(45) Date of Patent: Nov. 26, 2024

(54) SEMICONDUCTOR INTERCONNECTION STRUCTURES AND METHODS OF FORMING THE SAME

(71) Applicant: TAIWAN SEMICONDUCTOR MANUFACTURING COMPANY, LTD., Hsinchu (TW)

(72) Inventors: Kai-Fang Cheng, Taoyuan (TW); Hsiao-Kang Chang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 220 days.

(21) Appl. No.: 17/401,961

(22) Filed: Aug. 13, 2021

(65) Prior Publication Data

US 2022/0344259 A1 Oct. 27, 2022

Related U.S. Application Data

(60) Provisional application No. 63/178,689, filed on Apr. 23, 2021.

(51) Int. Cl.
*H01L 23/522* (2006.01)
*H01L 21/768* (2006.01)

(52) U.S. Cl.
CPC .... *H01L 23/5226* (2013.01); *H01L 21/76831* (2013.01); *H01L 21/76832* (2013.01); *H01L 21/76879* (2013.01)

(58) Field of Classification Search
CPC ............. H01L 23/5226; H01L 23/5342; H01L 23/5386; H01L 21/76831; H01L 21/76832; H01L 21/76879; H01L 21/76834; H01L 21/76849; H01L 21/76897; H01L 21/76826
See application file for complete search history.

(56) References Cited

U.S. PATENT DOCUMENTS

| | | | | |
|---|---|---|---|---|
| 5,766,379 A | * | 6/1998 | Lanford | C23C 14/024 148/285 |
| 6,077,770 A | * | 6/2000 | Hsu | H01L 21/76834 438/618 |
| 6,573,179 B1 | * | 6/2003 | Wang | H01L 21/76849 977/890 |
| 6,812,147 B2 | * | 11/2004 | Skinner | H01L 21/02063 257/E21.252 |

(Continued)

*Primary Examiner* — Dale E Page
*Assistant Examiner* — Quovaunda Jefferson
(74) *Attorney, Agent, or Firm* — NZ CARR LAW OFFICE

(57) ABSTRACT

An interconnection structure includes a first dielectric layer, a first conductive feature, a second dielectric layer, a conductive layer, a liner layer, a third dielectric layer, a second conductive feature, and a first capping layer. The first conductive feature is disposed in the first dielectric layer. The second dielectric layer is formed on the first dielectric layer, and the second dielectric layer is in direct contact with the first dielectric layer. The conductive layer is disposed in the second dielectric layer. The liner layer is disposed between the conductive layer and the second dielectric layer. The third dielectric layer is formed on the second dielectric layer. The second conductive feature is disposed in the third dielectric layer. The first capping layer is disposed between the second conductive feature and the third dielectric layer.

20 Claims, 19 Drawing Sheets

(56) References Cited

U.S. PATENT DOCUMENTS

| | | | | |
|---|---|---|---|---|
| 6,998,712 B2* | 2/2006 | Okada | ............... | H01L 23/564 |
| | | | | 257/E23.161 |
| 7,888,253 B2* | 2/2011 | Usui | ............... | H01L 21/7684 |
| | | | | 438/597 |
| 8,084,352 B2* | 12/2011 | Harada | ............... | H01L 23/5222 |
| | | | | 257/E21.585 |
| 9,105,490 B2 | 8/2015 | Wang et al. | | |
| 9,159,615 B2* | 10/2015 | Saito | ............... | H01L 21/76883 |
| 9,236,267 B2 | 1/2016 | De et al. | | |
| 9,236,300 B2 | 1/2016 | Liaw | | |
| 9,406,804 B2 | 8/2016 | Huang et al. | | |
| 9,443,769 B2 | 9/2016 | Wang et al. | | |
| 9,520,482 B1 | 12/2016 | Chang et al. | | |
| 9,548,366 B1 | 1/2017 | Ho et al. | | |
| 9,576,814 B2 | 2/2017 | Wu et al. | | |
| 9,831,183 B2 | 11/2017 | Lin et al. | | |
| 9,859,386 B2 | 1/2018 | Ho et al. | | |
| 10,461,027 B2* | 10/2019 | Lee | ............... | H01L 23/53238 |
| 2003/0111735 A1* | 6/2003 | Lee | ............... | H01L 21/76868 |
| | | | | 257/E21.585 |
| 2006/0088975 A1* | 4/2006 | Ueda | ............... | H01L 23/53295 |
| | | | | 438/421 |
| 2006/0125024 A1* | 6/2006 | Ishigaki | ............... | H01L 21/823842 |
| | | | | 257/E21.678 |
| 2017/0213792 A1* | 7/2017 | Nag | ............... | H01L 21/76849 |

\* cited by examiner

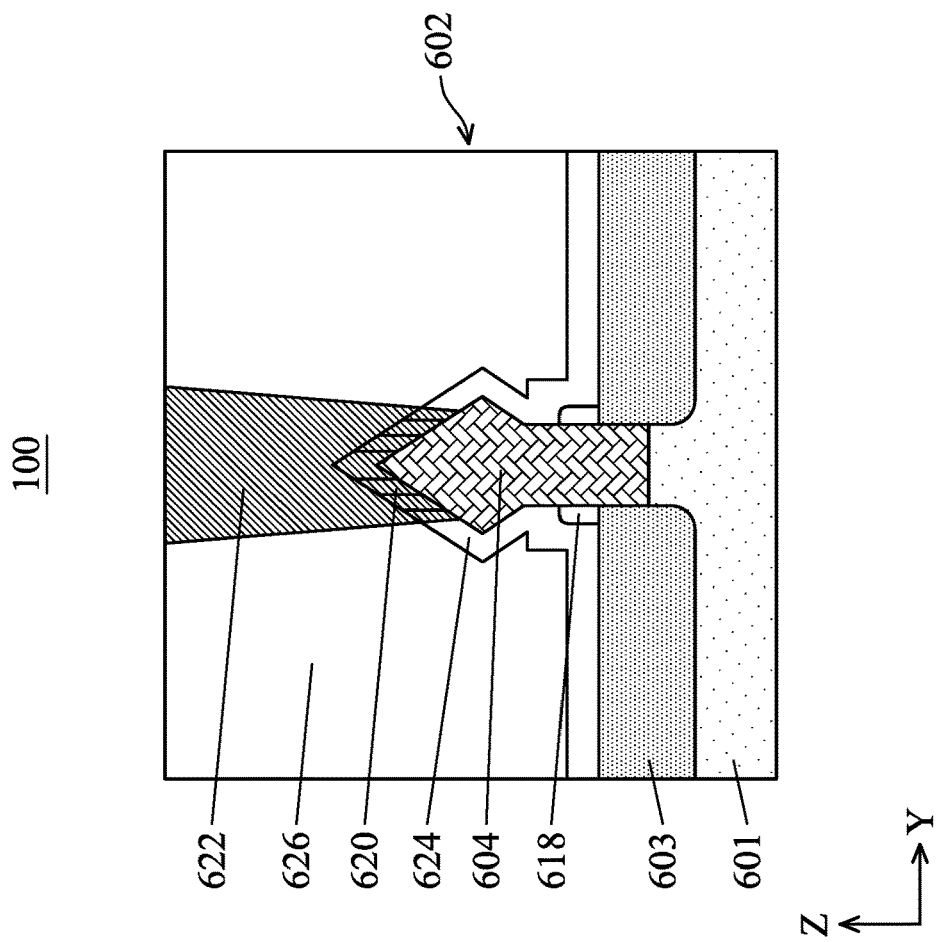
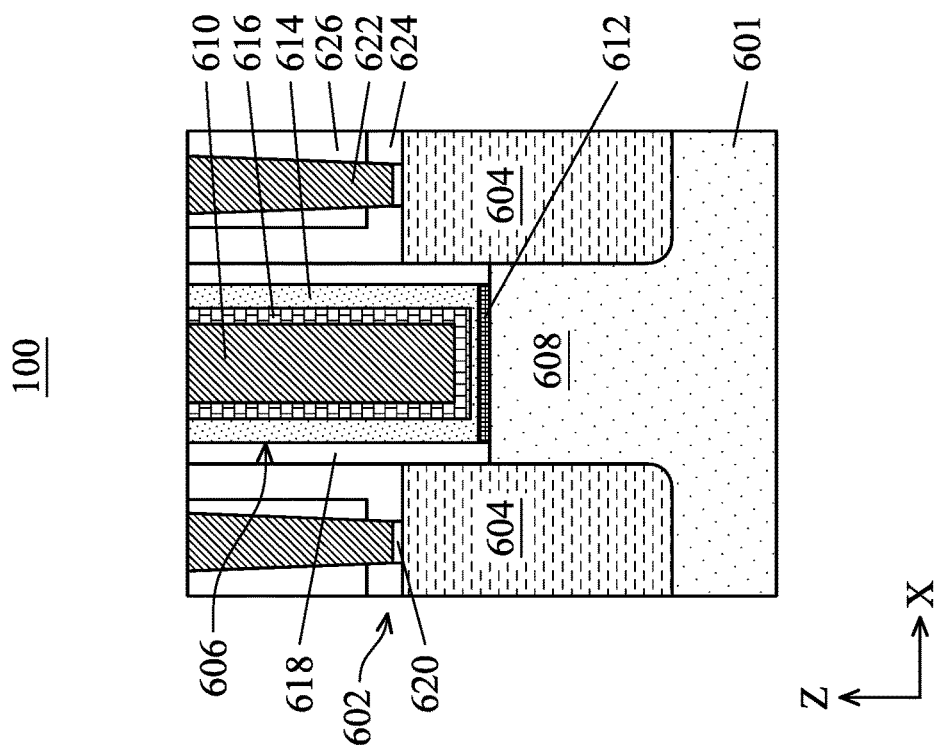
FIG. 2B
FIG. 2A

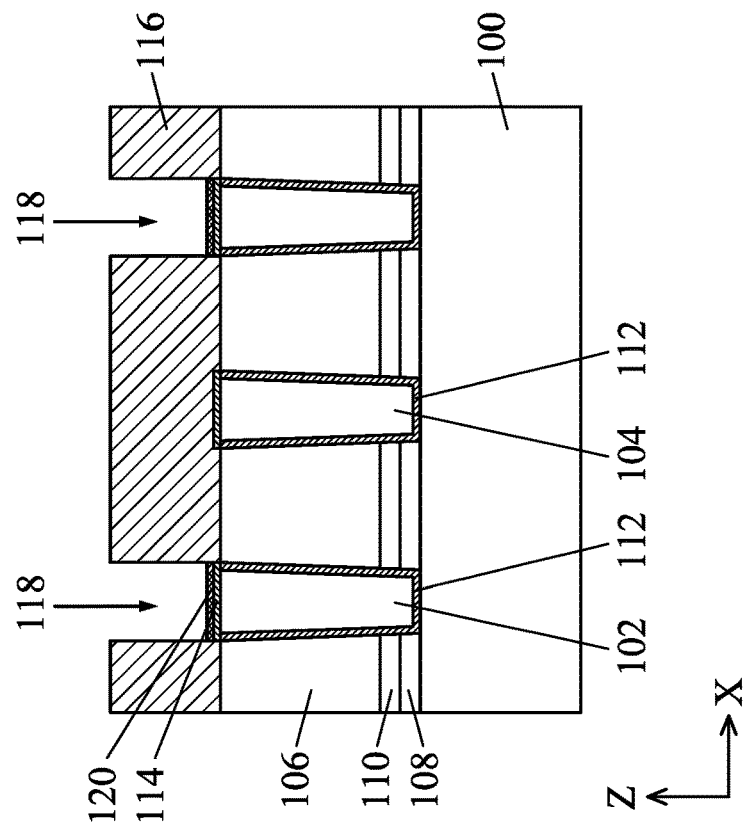
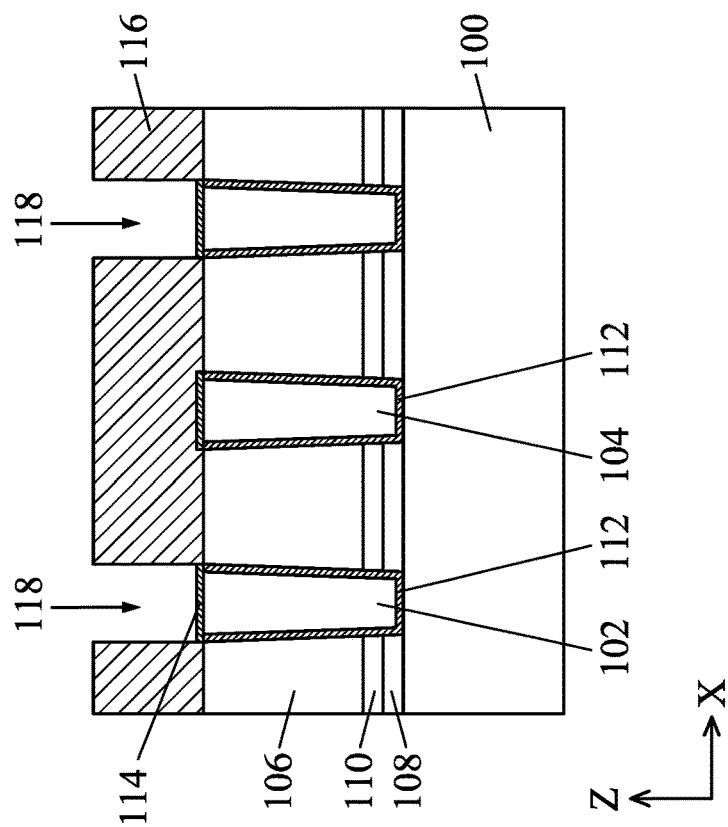
FIG. 3D
FIG. 3C

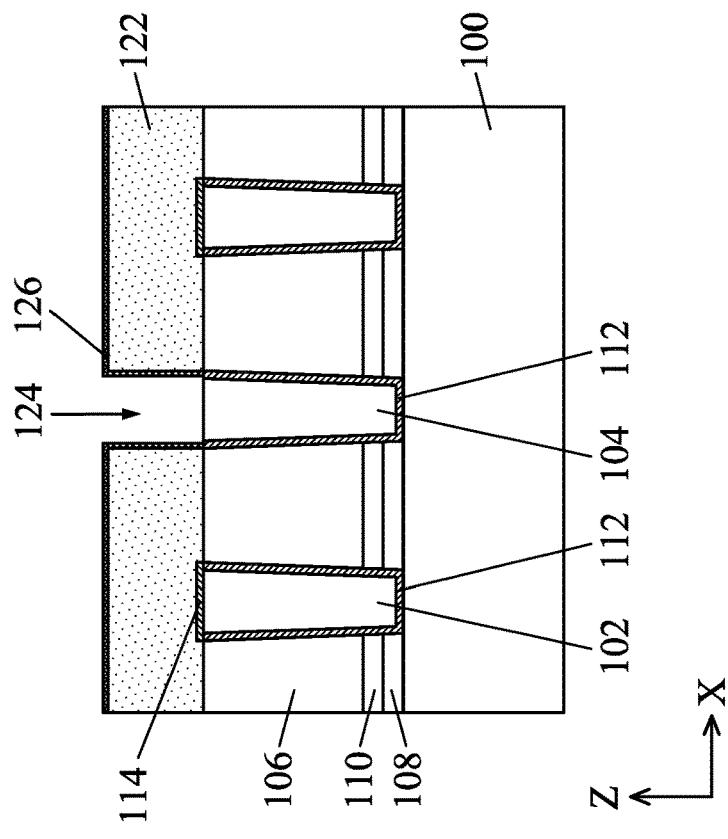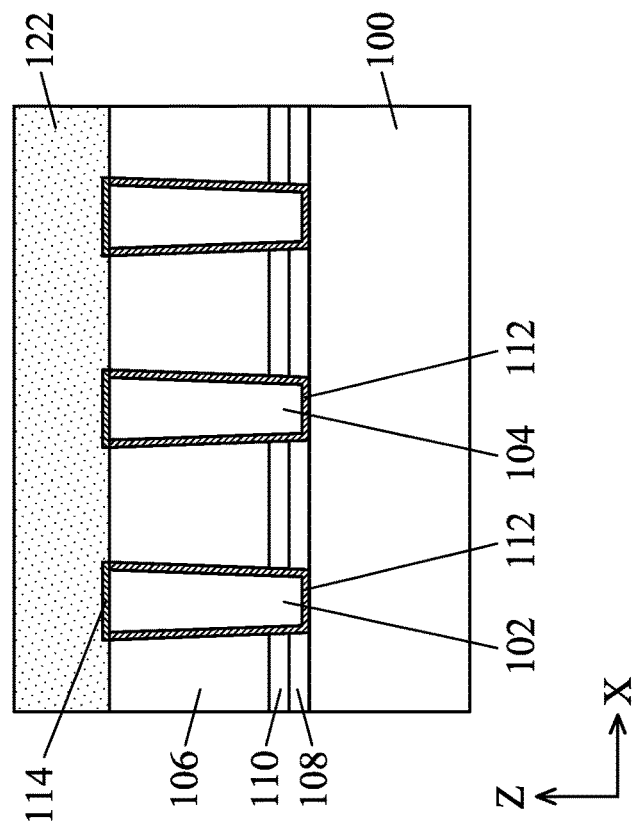

SEMICONDUCTOR INTERCONNECTION STRUCTURES AND METHODS OF FORMING THE SAME

BACKGROUND

As the semiconductor industry introduces new generations of integrated circuits (IC) having higher performance and more functionality, the density of the elements forming the ICs increases, while the dimensions, sizes and spacing between components or elements are reduced. The semiconductor industry continues to improve the integration density of various electronic components (e.g., transistors, diodes, resistors, capacitors, etc.) by continual reductions in minimum feature size, which allow more components to be integrated into a given area.

For manufacturing different conductive layers on the substrate, the self-aligned contact (SAC) process may be utilized to avoid misalignment. However, the integrated fabrication also brings out some issues, such as reliability, high capacitance, or high resistance. Therefore, there is a need in the art to provide improved devices or methods that can address the issues mentioned above.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2B are cross-sectional side views of various stages of manufacturing a semiconductor device structure, in accordance with some embodiments.

FIGS. 3A-3J are cross-sectional side views of various stages of manufacturing a semiconductor interconnection structure, in accordance with some embodiments.

FIGS. 5A-5E are cross-sectional side views of various stages of manufacturing a further semiconductor interconnection structure, in accordance with some embodiments.

DETAILED DESCRIPTION

Figure 1:
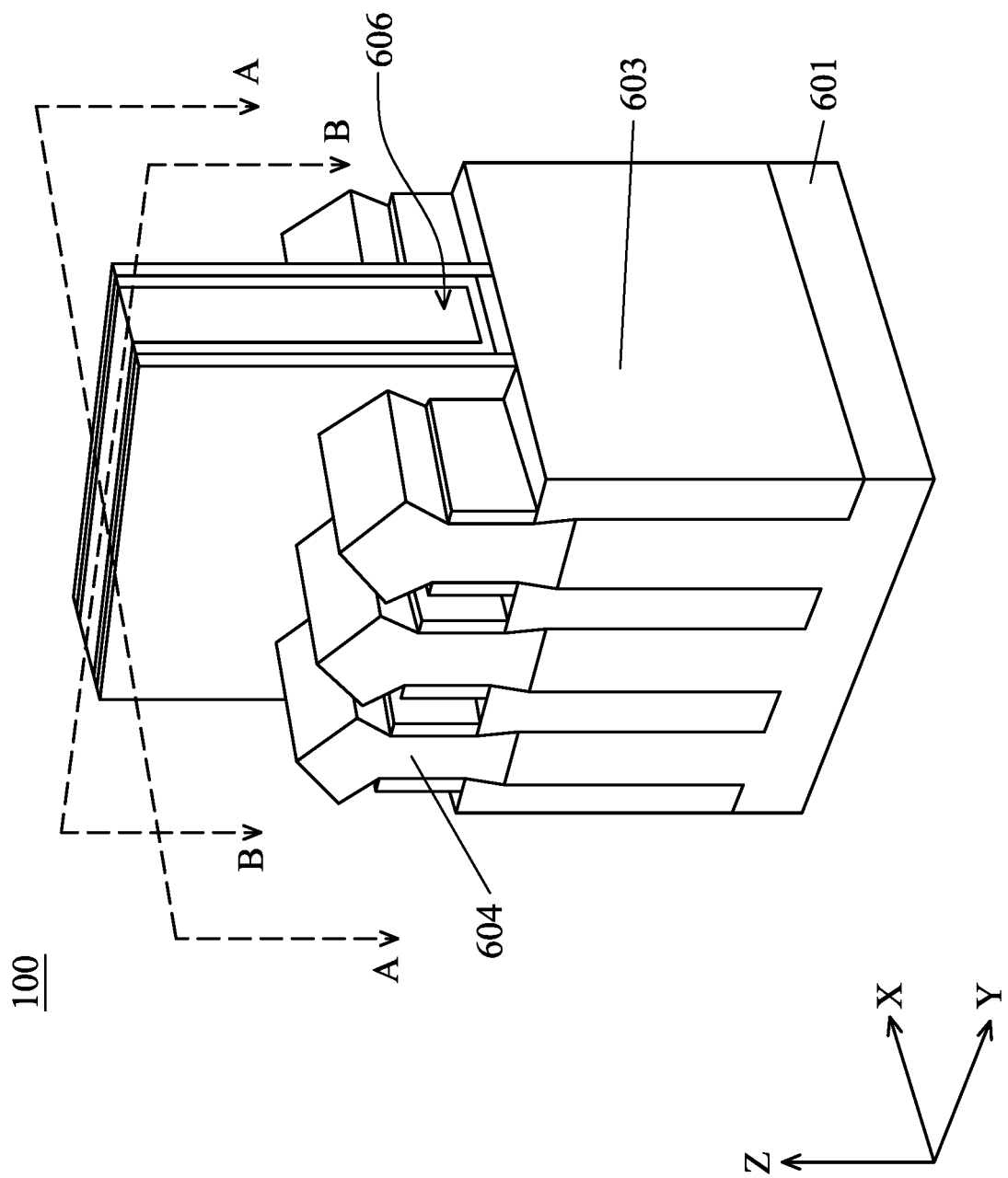
FIG. 1 is a perspective view of one of the various stages of manufacturing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a perspective view of one of the various stages of manufacturing a semiconductor device structure 100, in accordance with some embodiments. As shown in FIG. 1, the semiconductor device structure 100 includes a substrate 601 having at least a plurality of devices formed thereover. The devices, such as transistors, diodes, imaging sensors, resistors, capacitors, inductors, memory cells, a combination thereof, and/or other suitable devices, may be formed on substrate 601. In some embodiments, the interconnection structures may be formed on or below the devices.

FIGS. 2A-2B are cross-sectional side views of various stages of manufacturing semiconductor device structure 100, in accordance with some embodiments. FIG. 2A is a cross-sectional side view of semiconductor device structure 100 taken along line A-A of FIG. 1, and FIG. 2B is a cross-sectional side view of semiconductor device structure 100 taken along line B-B of FIG. 1. The line A-A of FIG. 1 extends along a direction that is substantially perpendicular to the longitudinal direction of a gate stack 606, and the line B-B of FIG. 1 extends along the longitudinal direction of the gate stack 606. As shown in FIGS. 2A and 2B, semiconductor device structure 100 includes substrate 601, one or more devices 602 formed on substrate 601. The interconnection structures may be formed over devices 602.

Substrate 601 may be a semiconductor substrate. In some embodiments, substrate 601 includes a single crystalline semiconductor layer on at least the surface of substrate 601. Substrate 601 may include a single crystalline semiconductor material such as, but not limited to silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), and indium phosphide (InP). In some embodiment, substrate 601 is made of Si. In some embodiments, substrate 601 is a silicon-on-insulator (SOI) substrate, which includes an insulating layer (not shown) disposed between two silicon layers. In one aspect, the insulating layer is an oxygen-containing material, such as an oxide.

Substrate 601 may include various regions that have been suitably doped with impurities (e.g., p-type or n-type impurities). The dopants are, for example phosphorus for an n-type fin field effect transistor (FinFET) and boron for a p-type FinFET.

As described above, devices 602 may be any suitable devices, such as transistors, diodes, imaging sensors, resistors, capacitors, inductors, memory cells, or a combination thereof. In some embodiments, devices 602 are transistors, such as planar field effect transistors (FETs), FinFETs, nanostructure transistors, or other suitable transistors. The nanostructure transistors may include nanosheet transistors, nanowire transistors, gate-all-around (GAA) transistors, multi-bridge channel (MBC) transistors, or any transistors having the gate electrode partially or fully surrounding the channels. An example of device 602 formed between substrate 601 and the interconnection structures (such as the interconnection structure 200 shown in FIGS. 3A-3J) may be a FinFET or a nanostructure, which is shown in FIGS. 2A and 2B. An exemplary device 602 may include source/drain (S/D) regions 604 and a gate stack 606 disposed between S/D regions 604 serving as source regions and S/D regions 604 serving as drain regions. While there is only one gate stack 606 formed on substrate 601, it is contemplated that two or more gate stacks 606 may also be formed on substrate 601. Channel regions 608 are formed between S/D regions 604 serving as source regions and S/D regions 604 serving as drain regions.

S/D regions 604 may include a semiconductor material, such as Si or Ge, a III-V compound semiconductor, an II-VI compound semiconductor, or other suitable semiconductor material. Exemplary S/D region 604 may include, but are not limited to, Ge, SiGe, GaAs, AlGaAs, GaAsP, SiP, InAs, AlAs, InP, GaN, InGaAs, InAlAs, GaSb, AlP, GaP, and the like. S/D regions 604 may include p-type dopants, such as boron; n-type dopants, such as phosphorus or arsenic; and/or other suitable dopants including combinations thereof. S/D regions 604 may be formed by an epitaxial growth method using CVD, atomic layer deposition (ALD) or molecular beam epitaxy (MBE). Channel regions 608 may include one or more semiconductor materials, such as Si, Ge, GeSn, SiGe, GaAs, InSb, GaP, GaSb, InAlAs, InGaAs, GaSbP, GaAsSb, GaN, GaP, or InP. In some embodiments, channel regions 608 include the same semiconductor material as substrate 601. In some embodiments, devices 602 are FinFETs, and channel regions 608 are a plurality of fins each having at least three surfaces wrapped around by the gate stack 606. In some other embodiments, devices 602 are nanosheet transistors, and channel regions 608 are surrounded by gate stack 606.

Each gate stack 606 includes a gate electrode layer 610 disposed over channel region 608 or partially/fully surrounding channel region 608. Gate electrode layer 610 may be a metal-containing material such as tungsten, cobalt, aluminum, ruthenium, copper, multilayers thereof, or the like, and can be deposited by ALD, plasma enhanced chemical vapor deposition (PECVD), MBD, physical vapor deposition (PVD), or any suitable deposition technique. Each gate stack 606 may include an interfacial dielectric layer 612, a gate dielectric layer 614 disposed on interfacial dielectric layer 612, and one or more conformal layers 616 disposed on gate dielectric layer 614. Gate electrode layer 610 may be disposed on conformal layers 616. Interfacial dielectric layer 612 may include a dielectric material, such as an oxygen-containing material or a nitrogen-containing material, or multilayers thereof, and may be formed by any suitable deposition method, such as CVD, PECVD, or ALD. Gate dielectric layer 614 may include a dielectric material such as an oxygen-containing material or a nitrogen-containing material, a high-k dielectric material having a k value greater than that of silicon dioxide, or multilayers thereof. Gate dielectric layer 614 may be formed by any suitable method, such as CVD, PECVD, or ALD. Conformal layers 616 may include one or more barrier layers and/or capping layers, such as a nitrogen-containing material, for example tantalum nitride (TaN), titanium nitride (TiN), or the like. Conformal layers 616 may further include one or more work-function layers, such as aluminum titanium carbide, aluminum titanium oxide, aluminum titanium nitride, or the like. The term "conformal" may be used herein for ease of description upon a layer having substantial same thickness over various regions. Conformal layers 616 may be deposited by ALD, PECVD, MBD, or any suitable deposition technique.

One or more gate spacers 618 are formed along sidewalls of gate stack 606 (e.g., sidewalls of gate dielectric layers 614). Gate spacers 618 may include silicon oxycarbide, silicon nitride, silicon oxynitride, silicon carbon nitride, the like, multi-layers thereof, or a combination thereof, and may be deposited by CVD, PVD, ALD, or other suitable deposition technique.

Portions of gate stacks 606 and gate spacers 618 may be formed on isolation regions 603. Isolation regions 603 are formed on substrate 601. Isolation regions 603 may include an insulating material such as an oxygen-containing material, a nitrogen-containing material, or a combination thereof. The insulating material may be formed by a high-density plasma chemical vapor deposition (HDP-CVD), a flowable chemical vapor deposition (FCVD), or other suitable deposition process. In one aspect, isolation regions 603 includes silicon oxide that is formed by a FCVD process.

A contact etch stop layer (CESL) 624 is formed on a portion of S/D regions 604 and isolation region 603, and a first interlayer dielectric (ILD) 626 is formed on CESL 624. CESL 624 can provide a mechanism to stop an etch process when forming openings in first ILD 626. CESL 624 may be conformally deposited on surfaces of S/D regions 604 and isolation regions 603. CESL 624 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be deposited by CVD, PECVD, PVD, ALD, or any suitable deposition technique. First ILD 626 may include an oxide formed by tetraethylorthosilicate (TEOS), un-doped silicate glass, or doped silicon oxide such as borophosphosilicate glass (BPSG), fused silica glass (FSG), phosphosilicate glass (PSG), boron doped silicon glass (BSG), organosilicate glass (OSG), SiOC, and/or any suitable low-k dielectric materials (e.g., a material having a dielectric constant lower than silicon dioxide), and may be deposited by spin-on, CVD, FCVD, PECVD, PVD, or any suitable deposition technique.

A silicide layer 620 is formed on at least a portion of each S/D region 604, as shown in FIGS. 2A and 2B. Silicide layer 620 may include a material having one or more of WSi, CoSi, NiSi, TiSi, MoSi and TaSi. In some embodiments, silicide layer 620 includes a metal or metal alloy silicide, and the metal includes a noble metal, a refractory metal, a rare earth metal, alloys thereof, or combinations thereof. A conductive contact 622 is disposed on each silicide layer 620. Conductive contact 622 may include a material having one or more of Ru, Mo, Co, Ni. W, Ti, Ta, Cu, Al, TiN or TaN, and conductive contact 622 may be formed by any suitable method, such as electro-chemical plating (ECP), or PVD. Silicide layer 620 and conductive contact 622 may be formed by first forming an opening in first ILD 626 and CESL 624 to expose at least a portion of S/D region 604, then forming silicide layer 620 on the exposed portion of S/D region 604, and then forming conductive contact 622 on silicide layer 620.

Figure 3B:
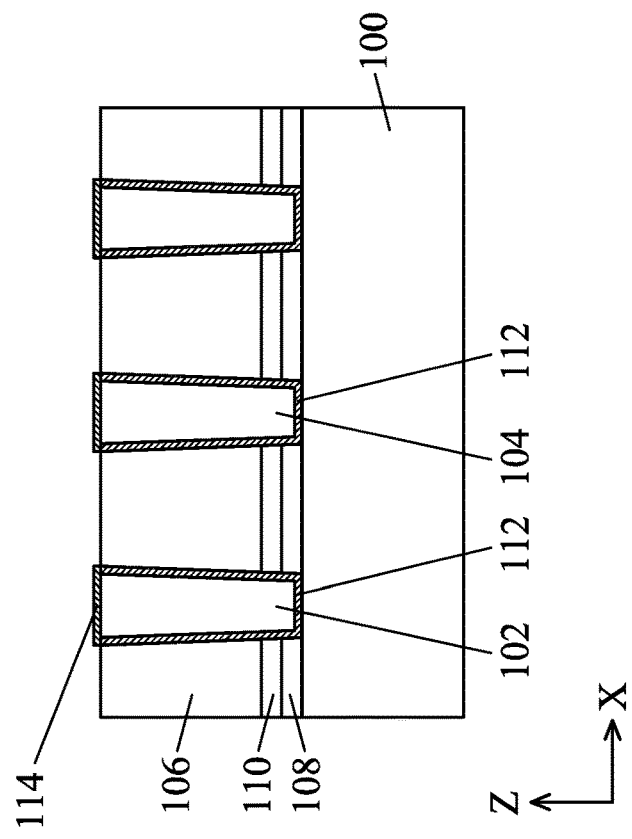
Figure 3A:
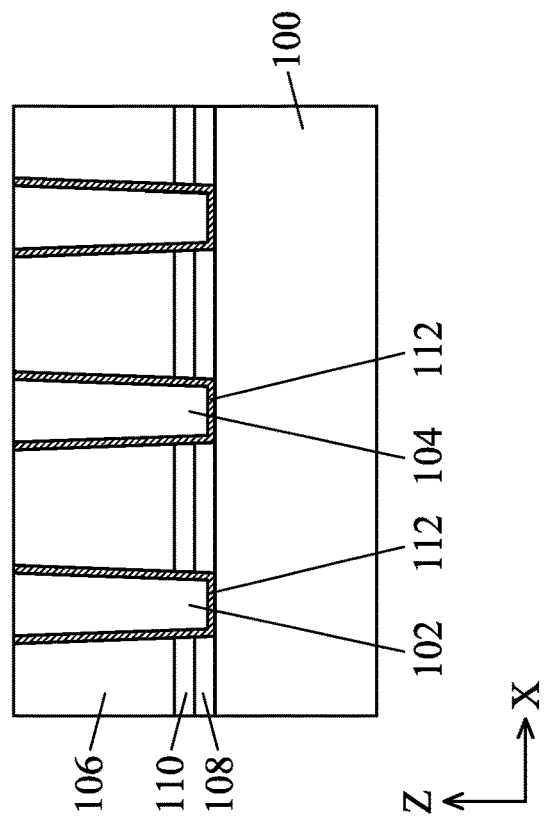
Figure 9:
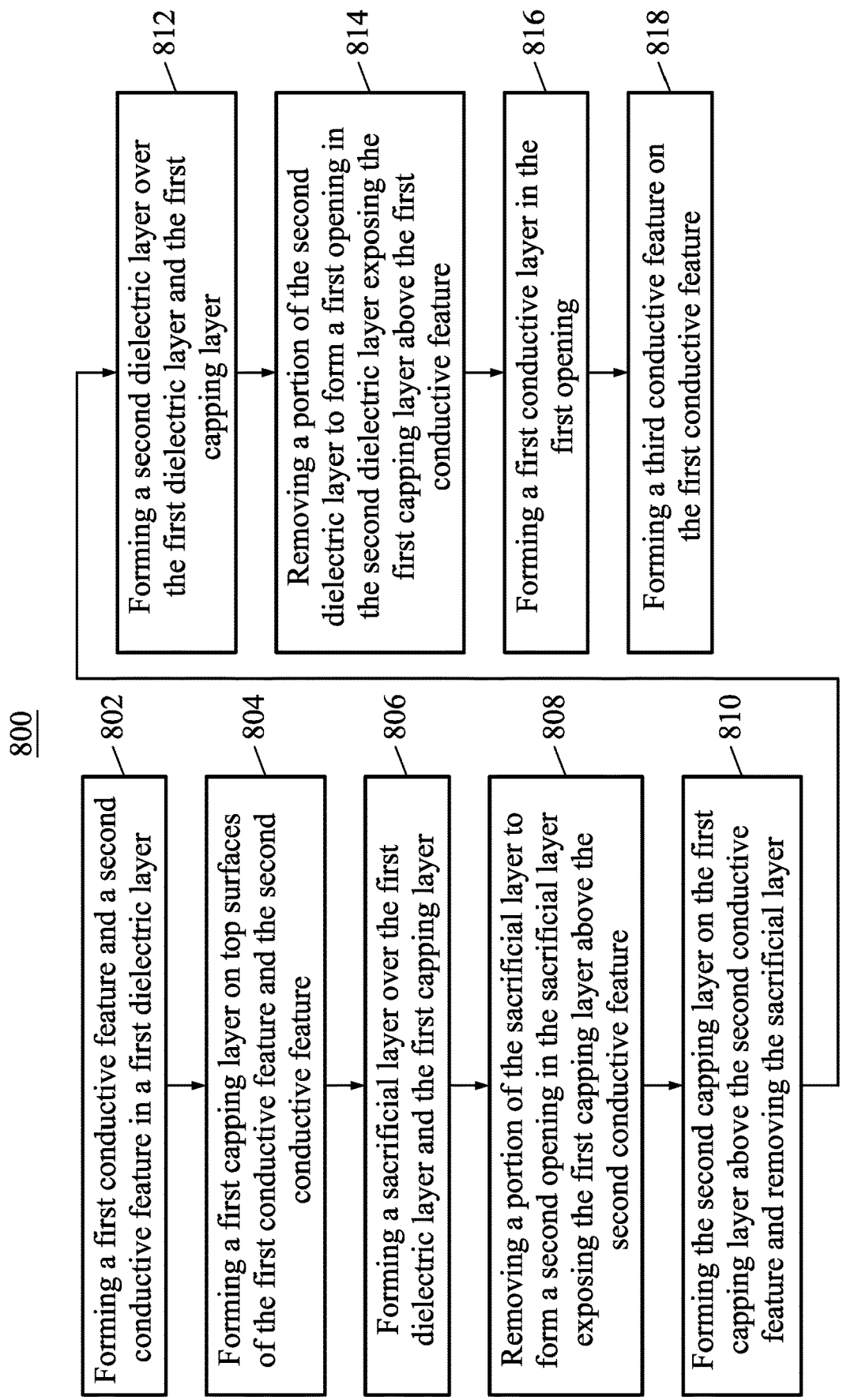
FIG. 9 is a flow chart of a method for manufacturing a semiconductor interconnection structure in accordance with some embodiments.

FIGS. 3A-3J are cross-sectional side views of various stages of manufacturing an interconnection structure 200, in accordance with some embodiments. In some embodiments, interconnection structure 200 may be formed on, over, and/or below semiconductor device structure 100. For example, as shown in FIG. 3A, interconnection structure 200 may be formed over a semiconductor device structure, such as the semiconductor device structure 100. It is understood that interconnection structure 200 is not limited to be formed directly over semiconductor device structure 100. Other structures, such as middle end of the line (MEOL) structures, may be formed between interconnection structure 200 and semiconductor device structure 100. Therefore, an interlayer dielectric of the interconnection structure 200, e.g., first dielectric layer 106 to be discussed below, may be an interlayer dielectric at any level of an interconnection structure. FIG. 9 is a flow chart of an exemplary method 800 for manufacturing interconnection structure 200 in accordance with some embodiments. For the purpose of better describing the present disclosure, the cross-sectional side views of interconnection structure 200 in FIGS. 3A-3J and method 800 in FIG. 9 will be discussed together. It is understood that the operations shown in method 800 are not exhaustive and that other operations may be performed as well before, after, or between any of the illustrated operations. Further, some of the operations may be performed simultaneously, or in a different order than shown in FIGS. 3A-3J and FIG. 9.

As shown in FIG. 3A and operation 802 in FIG. 9, a conductive feature 102 and a conductive feature 104 are formed in a first dielectric layer 106. In some embodiments, one or more etch stop layers (ESL) 108 and 110 may be formed under first dielectric layer 106. ESL 108 and 110 may be used when forming conductive feature 102 and conductive feature 104 in first dielectric layer 106 to control the etching depth in first dielectric layer 106. In some embodiments, ESL 108 may include SiNx, SiCxNy, AlNx, AlOx, AOxNy, or other suitable materials. In some embodiments, ESL 108 may be formed in a temperature lower than 425 degrees Celsius by CVD, PVD, ALD, spin coating, or other suitable processes. In some embodiments, ESL 110 may include SiOx, SiCx, SiOxCy, or other suitable materials. In some embodiments, ESL 110 may be formed in the temperature between 425 degrees Celsius and 150 degrees Celsius by CVD, PVD, ALD, spin coating, or other suitable processes.

In some embodiments, first dielectric layer 106 may include or be made of SiOx, SiOxCyHz, SiOxCy, SiCx, or related low-k materials in amorphous state. The k value of first dielectric layer 106 may be in the range between 1.0-5.0. In some embodiments, first dielectric layer 106 may include or be made of SiOx, SiOxCyHz, SiOxCy, SiCx, or related low-k materials with ordered pores. The term "ordered pores" used herein refers to air-filled voids or air gaps having a predefined arrangement formed in a dielectric material. First dielectric layer 106 with ordered pores has the characteristics of low dielectric constant and high mechanical strength. In some embodiments, first dielectric layer 106 may be formed in the temperature between 425 degrees Celsius and 150 degrees Celsius by CVD, PVD, ALD, spin coating, or other suitable processes. In some embodiments, first dielectric layer 106 may be formed with or without additional anneal or ultraviolet (UV) curing process. In some embodiments, conductive feature 102 and conductive feature 104 may include Cu, Ni, Co, Ru, Ir, Al, Pt, Pd, Au, Ag, Os, W, Mo and related alloys. In some embodiments, conductive feature 102 and conductive feature 104 may be formed in the temperature between 425 degrees Celsius and 150 degrees Celsius by ALD, CVD, PVD, electroless deposition (ELD), ECP, or other suitable processes.

In some embodiments, a barrier layer 112 may be formed between first dielectric layer 106 and conductive feature 102 and between first dielectric layer 106 and conductive feature 104. In some embodiments, in operation 802, conductive feature 102 and conductive feature 104 may be formed in first dielectric layer 106 by dual damascene, single damascene, semi damascene, or other suitable processes. By using the single damascene process as an example, ESL 108, ESL 110, and first dielectric layer 106 are sequentially deposited and etched to form the openings according to the predefined patterns. Barrier layer 112 is then deposited in the openings, and a conductive material, such as Cu, is deposited on barrier layer 112. The deposition of the conductive material on barrier layer 112 in the openings may include forming a seed layer on barrier layer 112 by PVD process and then forming the conductive material on the seed layer by electrodeposition process. The top surface of the conductive material is then planarized so that top surfaces of conductive feature 102 and conductive feature 104, barrier layer 112, and first dielectric layer 106 are substantially co-planar.

As shown in FIG. 3B and operation 804 in FIG. 9, a first capping layer 114 is formed on top surfaces of conductive feature 102 and conductive feature 104. In some embodiments, first capping layer 114 may include SiNx or other suitable materials. In some embodiments, first capping layer 114 may be formed in the temperature between 450 degrees Celsius and 150 degrees Celsius by CVD, PVD, ALD or other suitable processes. For example, first capping layer 114 may be formed in the temperature lower than 200 degrees Celsius by a thermal ALD process.

As shown in FIG. 3C and operations 806 and 808 in FIG. 9, a sacrificial layer 116 is formed over first dielectric layer 106 and first capping layer 114, and a portion of sacrificial layer 116 is removed to form an opening 118 in sacrificial layer 116 exposing first capping layer 114 above conductive feature 102. In some embodiments, sacrificial layer 116 may include a carbon-containing layer in an amorphous state. In one embodiment, the sacrificial layer 116 is an amorphous carbon. Opening 118 may be formed by dry etch, wet etch, or other suitable processes.

As shown in FIG. 3D and operation 810 in FIG. 9, a second capping layer 120 is formed in opening 118 on first capping layer 114 above conductive feature 102. Then, as shown in FIG. 3E and operation 810 in FIG. 9, sacrificial layer 116 is removed. In some embodiments, second capping layer 120 may include HfOx, TiOx, or other suitable materials. In some embodiments, second capping layer 120 may be formed in the temperature between 450 degrees Celsius and 150 degrees Celsius by CVD, PVD, ALD or other suitable processes. In some embodiments, before forming second capping layer 120 on first capping layer 114, a pre-treatment process may be performed to assist in selective deposition of second capping layer 120 on first capping layer 114. The pre-treatment process may be performed by exposing the interconnection structure 200 to a $H_2$ plasma formed from hydrogen-containing precursor, such as hydrogen, ammonia, hydrocarbons, or the like, or any combination thereof.

For example, the H2 plasma may change the surface functionalities of sacrificial layer 116 by reducing the number of unwanted hydroxyl groups on the surface of the carbon-containing layer and providing strong chemical modification of the carbon-containing layer via surface hydrogenation. The treated surface of the carbon-containing layer leads to a delay in the nucleation of second capping layer 120. For example, during the deposition of second capping layer 120, HfOx, or TiOx may be easier to bond with first capping layer 114, e.g., SiNx, than with the treated surface of the carbon-containing layer in the amorphous state. Hence, the pre-treatment process can assist in selective deposition of second capping layer 120 on first capping layer 114.

Figure 3F:
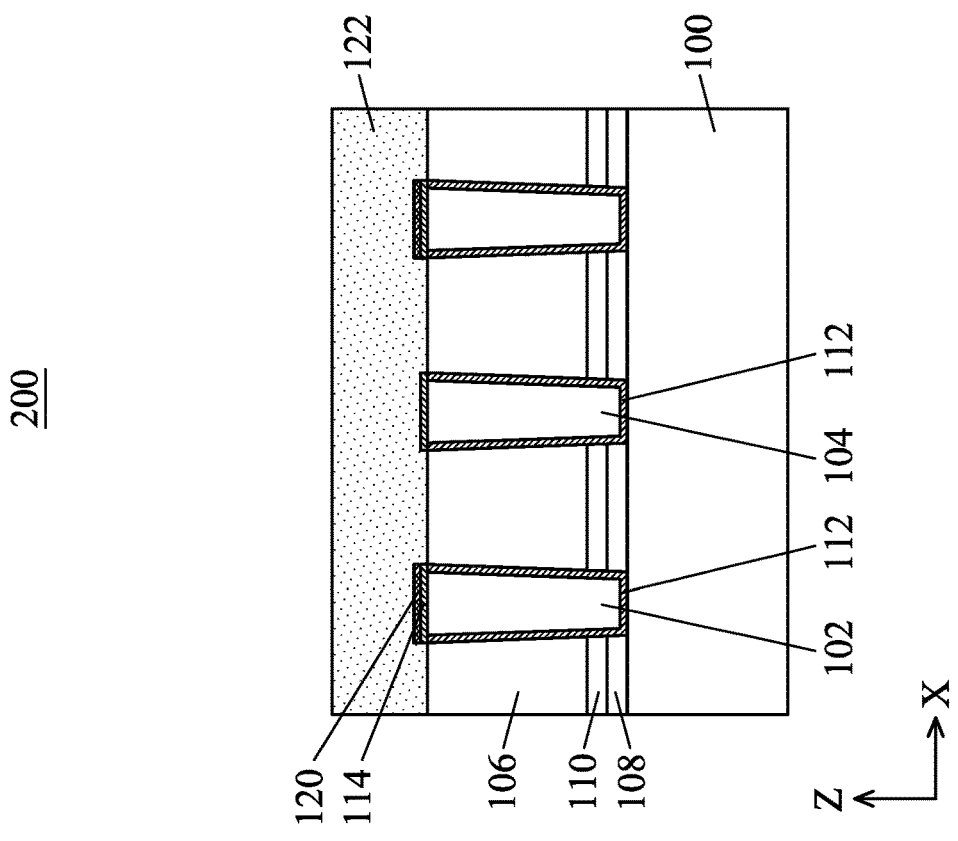
Figure 3E:
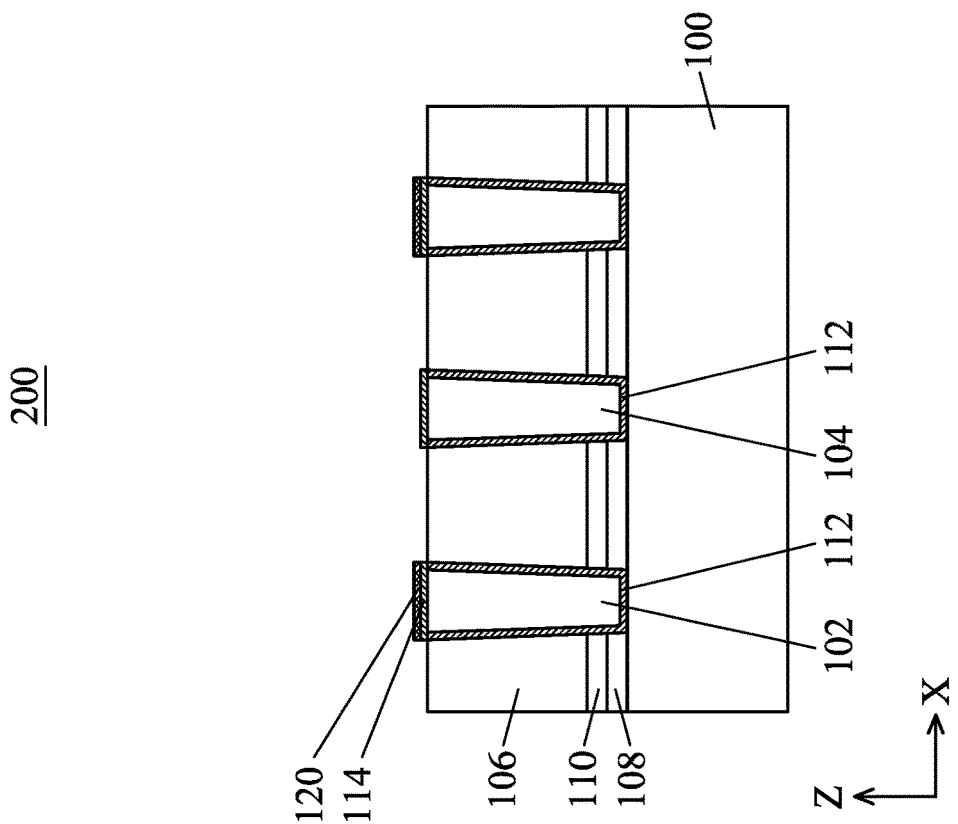

As shown in FIG. 3F and operation 812 in FIG. 9, a second dielectric layer 122 is formed over first dielectric layer 106, first capping layer 114 (above conductive feature 104) and second capping layer 120 (above conductive feature 102). In some embodiments, second dielectric layer 122 may include SiOx, SiOxCyHz, SiOxCy, SiCx, or related low-k materials with ordered pores. The k value of second dielectric layer 122 may be in the range between 1.0-3.0. In some embodiments, second dielectric layer 122 may be formed in the temperature between 425 degrees Celsius and 150 degrees Celsius by CVD, PVD, ALD, spin coating, or other suitable processes. In some embodiments, second dielectric layer 122 may be formed with or without additional anneal or UV curing process. In some embodiments, first dielectric layer 106 and second dielectric layer 122 may be formed of the same material.

As shown in operation 814 in FIG. 9, a portion of second dielectric layer 122 is removed to form an opening 124 in second dielectric layer 122 exposing first capping layer 114 above conductive feature 104. In some embodiments, first capping layer 114 may be removed as well to expose the top surface of conductive feature 104, as shown in FIG. 3G.

A liner layer 126 may be formed on sidewalls of opening 124 and on second dielectric layer 122. In some embodiments, liner layer 126 may include HfOx or other suitable materials. In some embodiments, liner layer 126 may be formed in the temperature between 450 degrees Celsius and 150 degrees Celsius by CVD, PVD, ALD or other suitable processes. Before forming liner layer 126, a pre-treatment process, such as $H_2$ plasma treatment discussed above, may be performed on second dielectric layer 122 and conductive feature 104. By performing the $H_2$ plasma treatment, the surface of second dielectric layer 122, e.g., SiOx, SiOxCyHz, SiOxCy or SiCx, and conductive feature 104, e.g., Cu, Ni, Co, Ru, Ir, Al, Pt, Pd, Au, Ag, Os, W or Mo, may have different deposition selectivity to liner layer 126, e.g., HfOx. Therefore, liner layer 126 is formed on sidewalls of opening 124 and on second dielectric layer 122, but not formed on conductive feature 104 (or hardly formed on conductive feature 104), as shown in FIG. 3G.

Figure 3H:
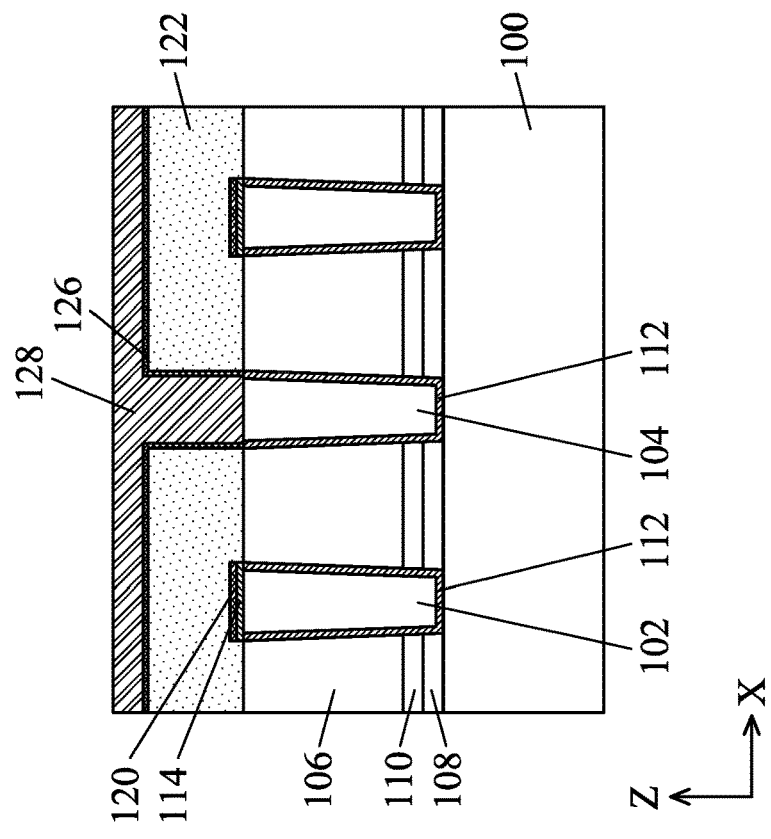
Figure 3G:
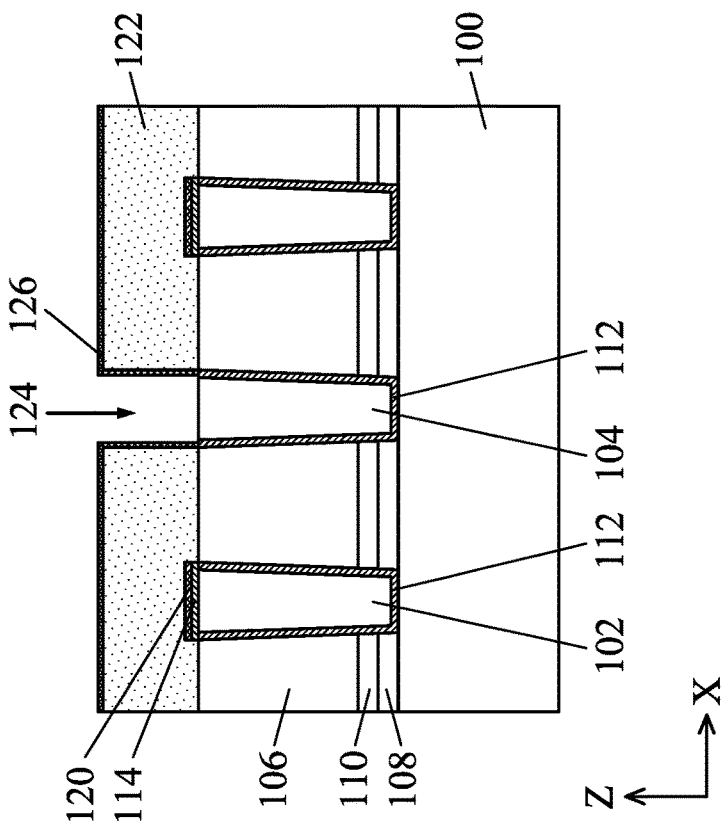

As shown in FIG. 3H and operation 816 in FIG. 9, a first conductive layer 128 is formed in opening 124 and over liner layer 126. The formation of the liner layer 126 allows first conductive layer 128 to be formed on liner layer 126 and conductive feature 104 in a self-aligned manner due to metallic properties shared by first conductive layer 128, liner layer 126, and conductive feature 104. In some embodiments, first conductive layer 128 may include Ru, Mo, related alloys, or other suitable materials. In some embodiments, first conductive layer 128 may be formed in the temperature between 425 degrees Celsius and 150 degrees Celsius by CVD, PVD, ALD or other suitable processes. Then, as shown in FIG. 3I and operation 818 in FIG. 9, portions of first conductive layer 128 are removed to form a conductive feature 134 on conductive feature 104.

In some embodiments, conductive feature 134 may be formed by dual damascene, single damascene, semi damascene, or other suitable processes. In some embodiments, conductive feature 134 may be formed by semi damascene process. In some embodiments, second dielectric layer 122 is patterned to form opening 124 and opening 124 is then filled with first conductive layer 128, e.g., Ru. First conductive layer 128 is overfilled in opening 124 and on second dielectric layer 122, which means the deposition of first conductive layer 128 continues until a layer of first conductive layer 128 is formed over second dielectric layer 122. Then, first conductive layer 128 is masked and etched to form conductive feature 134. For example, a mask may be disposed on first conductive layer 128 above conductive feature 104 and exposing first conductive layer 128 above conductive feature 102. Then, an etch operation is performed to remove first conductive layer 128 and liner layer 126 not covered by the mask and form conductive feature 134 on conductive feature 104. Conductive feature 134 may include a via structure in opening 124 and a conductive line on the via structure. In some embodiments, the via structure and the conductive line may be formed by the same material, as shown in FIG. 3I.

Figure 3J:
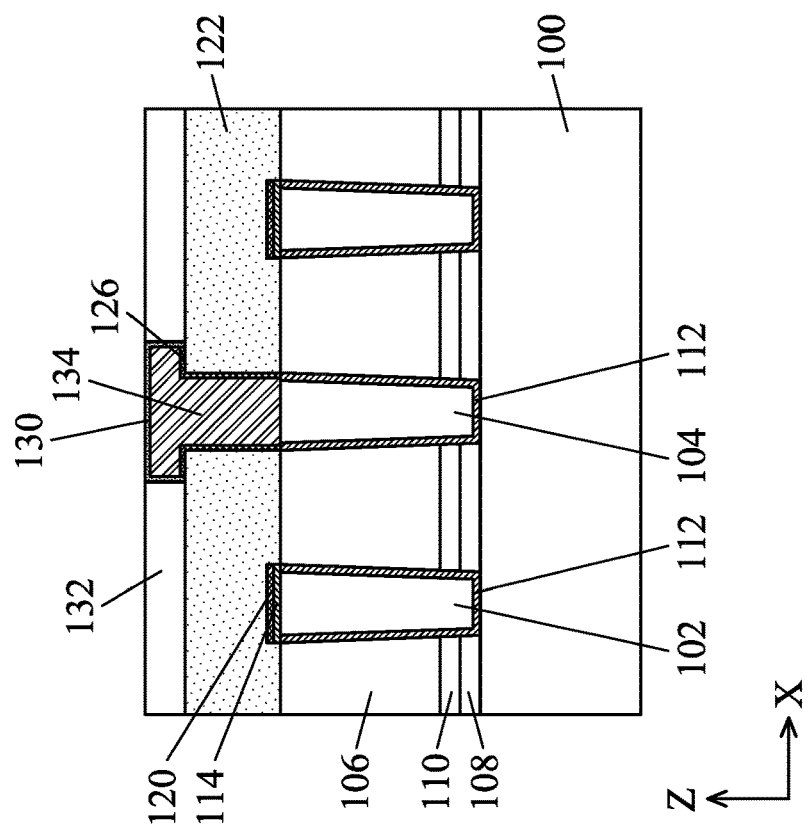
Figure 3I:
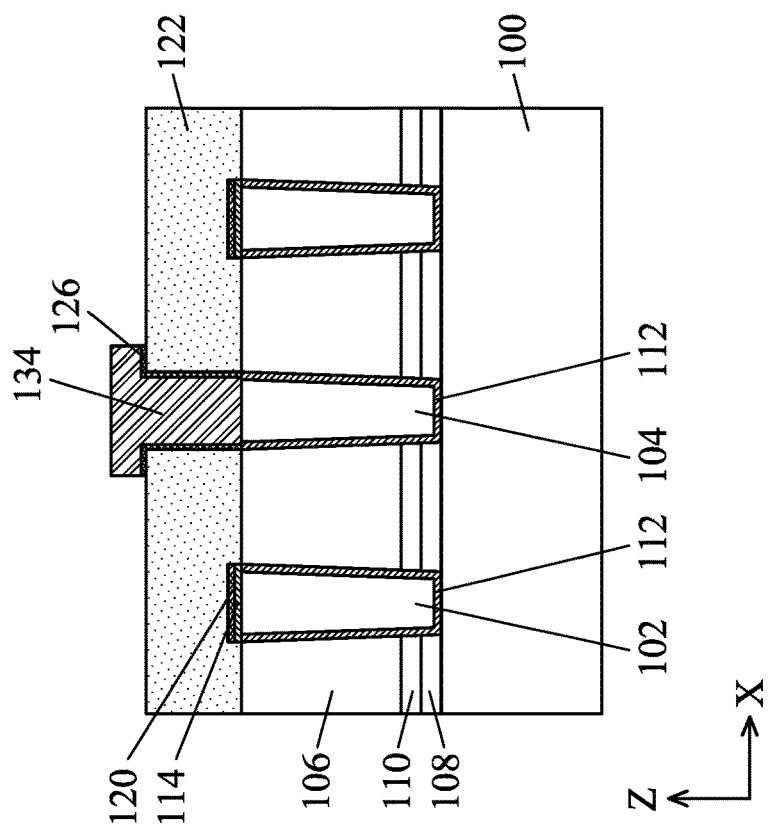

As shown in FIG. 3J, a third capping layer 130 is formed over conductive feature 134 and a third dielectric layer 132 is formed over second dielectric layer 122. Then, a planarization operation may be performed so that third capping layer 130 is coplanar to third dielectric layer 132. In some embodiments, third capping layer 130 may include SiOxCyHz, SiOxCy, SiCx, SiNx, SiCxNy, or other suitable materials. In some embodiments, third capping layer 130 may be formed in the temperature between 450 degrees Celsius and 150 degrees Celsius by CVD, PVD, ALD or other suitable processes. In some embodiments, third dielectric layer 132 may include SiOx, SiOxCyHz, SiOxCy, SiCx, or related low-k materials with or without ordered pores. The k value of third dielectric layer 132 may be in the range between 1.0-5.0. In some embodiments, third dielectric layer 132 may be formed in the temperature between 425 degrees Celsius and 150 degrees Celsius by CVD, PVD, ALD, spin coating, or other suitable processes. In some embodiments, third dielectric layer 132 may be formed with or without additional anneal or UV curing process. In some embodiments, third dielectric layer 132 and second dielectric layer 122 may be formed by the same material.

By forming conductive feature 134 on conductive feature 104 with the operations described above, a self-aligned interconnection structure can be formed without using self-assembled monolayer (SAM) process. SAM process is often used in self-alignment patterning process for the interconnection structure manufacturing process to prevent conductive materials from accumulating outside of the metal interconnect layer areas. However, using SAM process to form the self-aligned interconnection structure may have SAM residue remain on metal lines and/or unwanted reaction between SAM and subsequent deposition precursor(s), such as precursors for forming etch stop layers. By forming conductive feature 134 on conductive feature 104 with the operations described above without SAM process, the issues of using SAM process to form the self-aligned interconnection structure can be avoided, the reliability of the self-aligned interconnection structure can be improved, and the resistance of the interconnection structure can be reduced.

In addition, the self-aligned interconnection structure is achieved by performing the substrate modification, e.g., the H₂ plasma pre-treatment, before the selective deposition. The voids in the via metal gap can be prevented, and the resistance of the via can be reduced. Furthermore, there is no ESL needed between first dielectric layer 106 and second dielectric layer 122. In other words, first dielectric layer 106 is in direct contact with second dielectric layer 122. Since ESL has high dielectric constant, the interconnection structure without ESL can lower the capacitance.

Furthermore, first dielectric layer 106 and second dielectric layer 122 may include or be made of dielectric materials with ordered pores that have the characteristics of low dielectric constant and high mechanical strength. Hence, the k-value of first dielectric layer 106 and second dielectric layer 122 can be reduced, and the interconnection structure can also lower the capacitance. Using dielectric materials with ordered pores is advantageous in cases where misalignment occurs. For example, in some embodiments, when opening 118 is misaligned with conductive feature 102, because of the material of first dielectric layer 106 is low-k material with ordered pores that has high mechanical strength, the removal process of sacrificial layer 116 will not damage or hardly damage first dielectric layer 106.

Figure 4B:
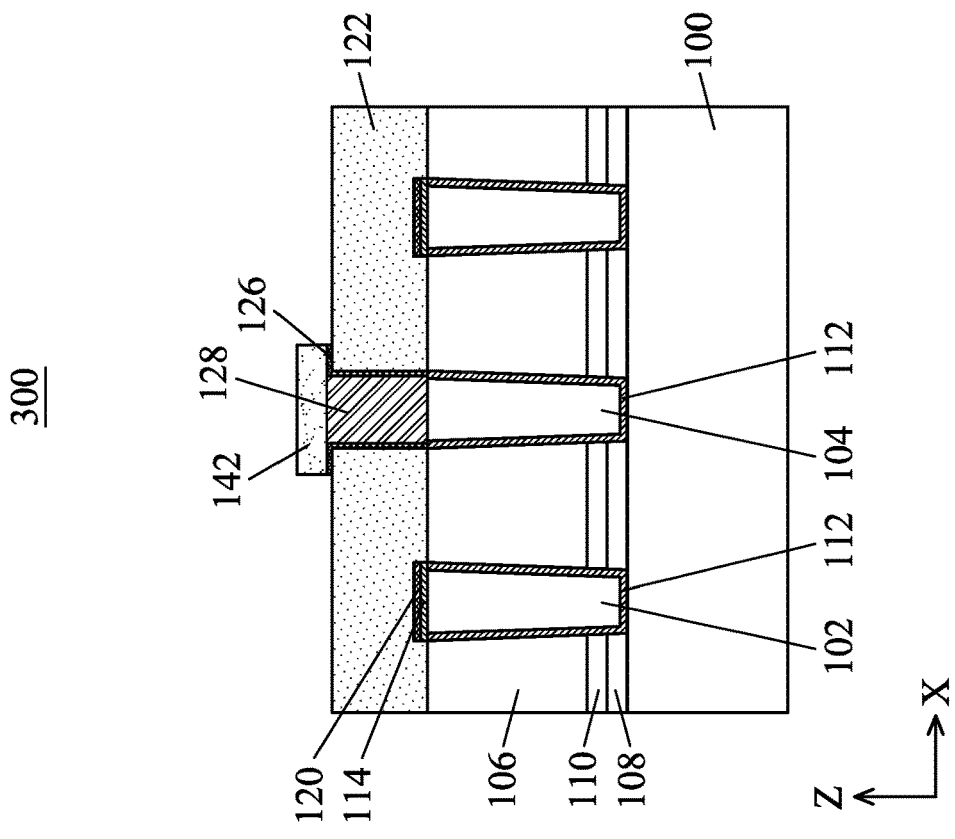
FIGS. 4A-4C are cross-sectional side views of various stages of manufacturing another semiconductor interconnection structure, in accordance with some embodiments.
Figure 4A:
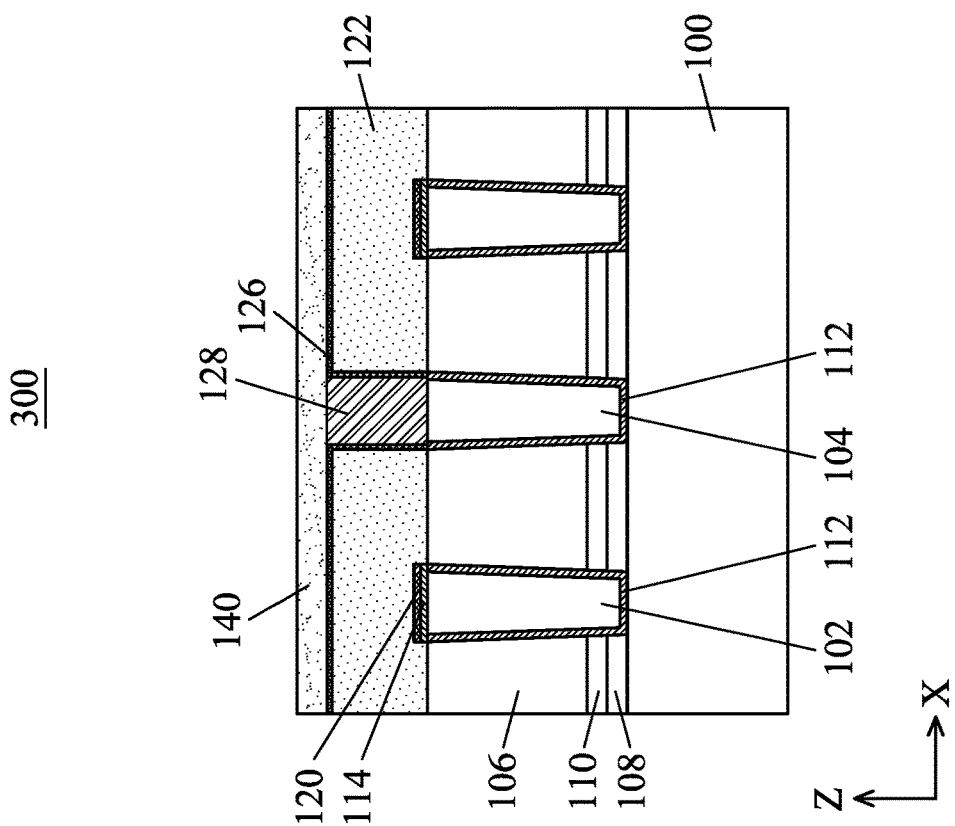
Figure 4C:
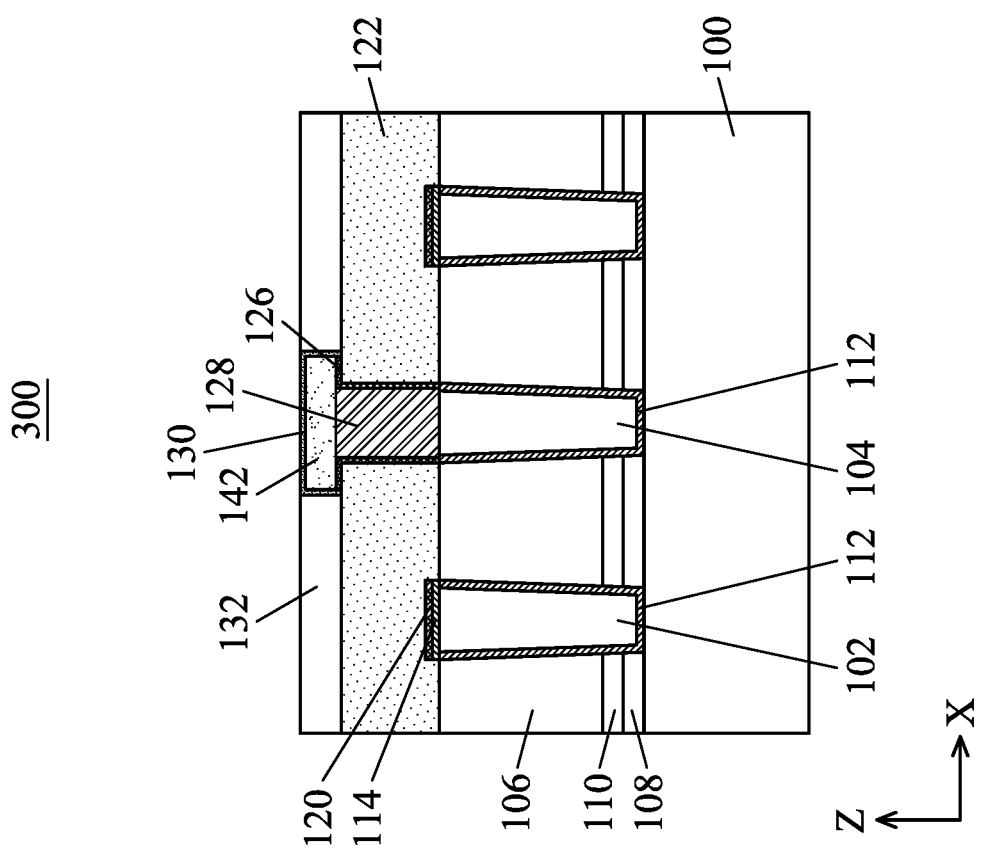

FIGS. 4A-4C are cross-sectional side views of various stages of manufacturing another interconnection structure 300, in accordance with some embodiments. Interconnection structure 300 in FIG. 4A, which is similar to interconnection structure 200, starts at a stage before forming conductive feature 134 as shown in FIGS. 3A-3G. However, the structure and the manufacturing process of conductive feature 134 of interconnection structure 200 is different from interconnection structure 300.

As shown in FIG. 4A, first conductive layer 128 is formed in opening 124 and a second conductive layer 140 is formed on first conductive layer 128 and over liner layer 126. In some embodiments, after forming first conductive layer 128 in opening 124, a planarization operation, e.g., chemical mechanical polishing (CMP), may be performed on first conductive layer 128. In some embodiments, first conductive layer 128 may include Ru, Mo, related alloys, or other suitable materials, and second conductive layer 140 may include Cu, Ni, Co, Ru, Ir, Al, Pt, Pd, Au, Ag, Os, W, Mo, related alloys, or other suitable materials. In some embodiments, first conductive layer 128 may be formed in the temperature between 425 degrees Celsius and 150 degrees Celsius by CVD, PVD, ALD or other suitable processes, and second conductive layer 140 may be formed in the temperature between 425 degrees Celsius and 150 degrees Celsius by ALD, CVD, PVD, ELD, ECP or other suitable processes.

As shown in FIG. 4B, portions of second conductive layer 140 are removed to form a conductive feature 142 on conductive feature 104. For example, a mask may be disposed on second conductive layer 140 above conductive feature 104 and exposing second conductive layer 140 above conductive feature 102. Then, an etch operation is performed to remove second conductive layer 140 and liner layer 126 not covered by the mask and form conductive feature 142 on conductive feature 104. Conductive feature 142 includes a via structure formed by first conductive layer 128 and a conductive line formed by second conductive layer 140. Then, as shown in FIG. 4C, third capping layer 130 is formed over conductive feature 142 and third dielectric layer 132 is formed over second dielectric layer 122 in a similar fashion as discussed above with respect to FIG. 3J.

FIGS. 5A-5E are cross-sectional side views of various stages of manufacturing a further interconnection structure 400, in accordance with some embodiments. Interconnection structure 400, which is similar to interconnection structure 200, starts at a stage after first capping layer 114 as shown in FIGS. 3A-3B is formed. After forming first capping layer 114, interconnection structure 400 does not include second capping layer 120 of interconnection structure 200. In some embodiments, when conductive feature 102 is formed by high diffusion materials, e.g., Cu, first capping layer 114 and second capping layer 120 may be required to prevent the diffusion, as shown in FIGS. 3A-3B. However, in some embodiments, when conductive feature 102 is formed by low diffusion materials, e.g., Ru, forming first capping layer 114 on conductive feature 102 may be sufficient to prevent the diffusion, as shown in FIGS. 5A-5E.

As shown in FIG. 5A, after forming first capping layer 114, second dielectric layer 122 is formed over first dielectric layer 106 and first capping layer 114. The material and the manufacturing process of second dielectric layer 122 in interconnection structure 400 may be similar to the material and the manufacturing process of second dielectric layer 122 in interconnection structure 200 described above.

Then, as shown in FIG. 5B, a portion of second dielectric layer 122 is removed to form opening 124 in second dielectric layer 122, and liner layer 126 is formed on sidewalls of opening 124 and on second dielectric layer 122. The material and the manufacturing process of liner layer 126 in interconnection structure 400 may be similar to the material and the manufacturing process of liner layer 126 in interconnection structure 200 described above.

Figure 5D:
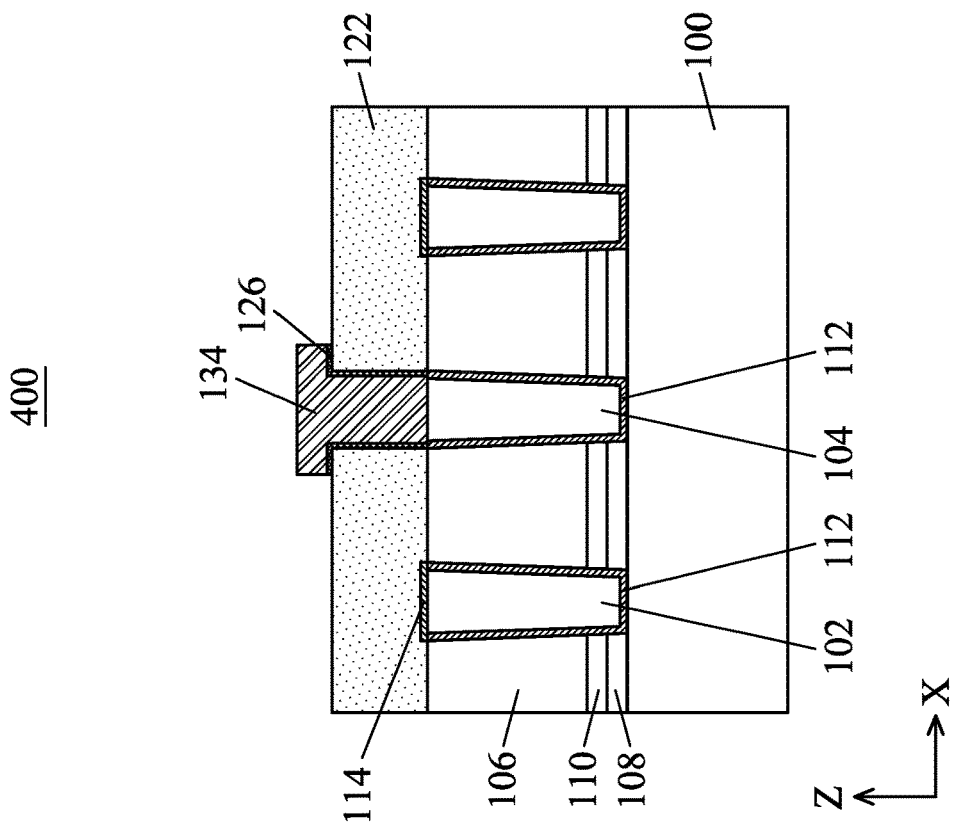
Figure 5C:
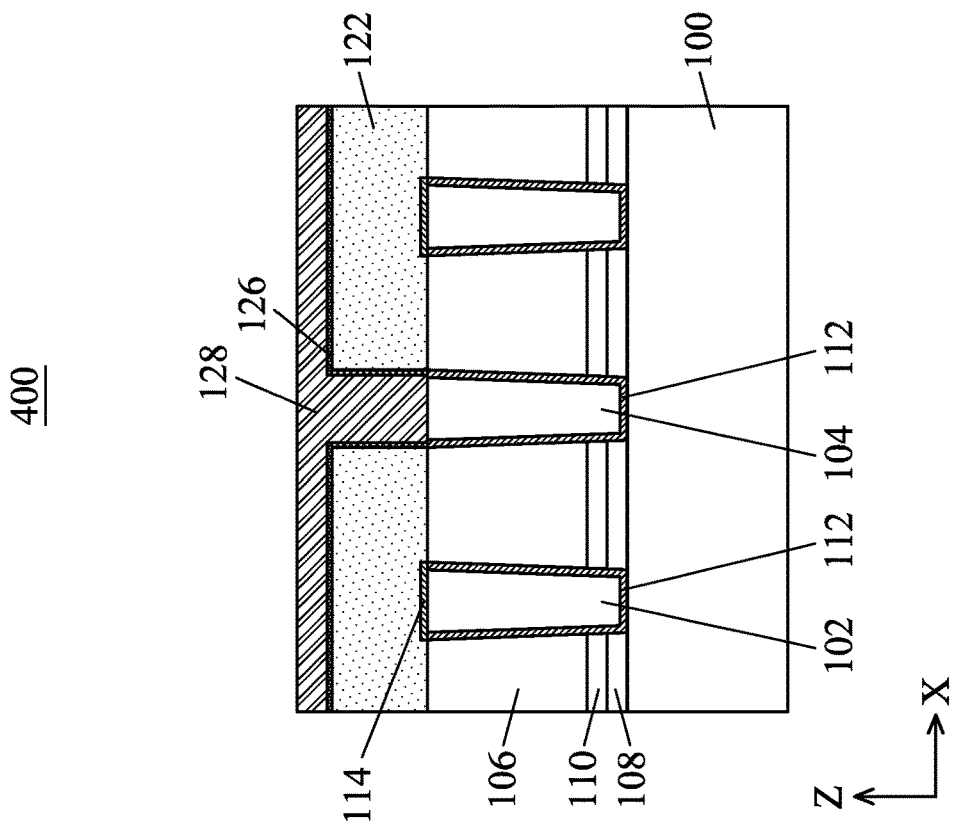

As shown in FIG. 5C, first conductive layer 128 is formed in opening 124 and over liner layer 126. Then, as shown in FIG. 5D, portions of first conductive layer 128 are removed to form conductive feature 134 on conductive feature 104. The material and the manufacturing process of first conductive layer 128 and conductive feature 134 in interconnection structure 400 may be similar to the material and the manufacturing process of first conductive layer 128 and conductive feature 134 in interconnection structure 200 described above.

Figure 5E:
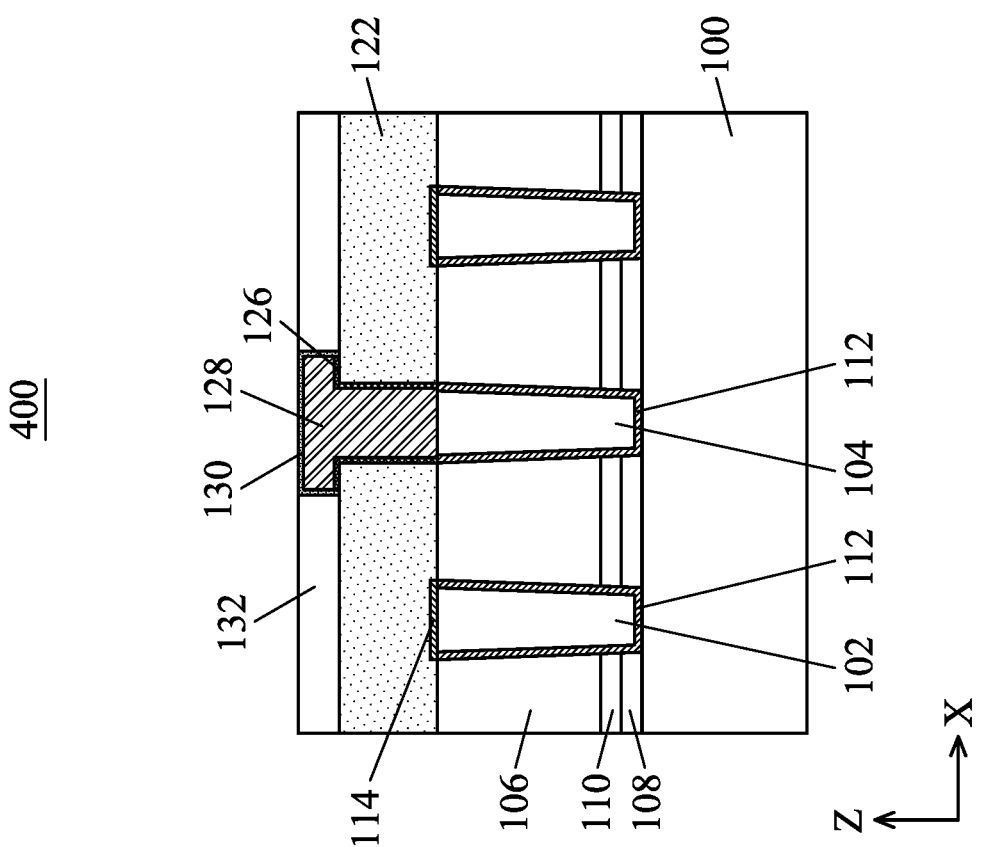

As shown in FIG. 5E, third capping layer 130 is formed over conductive feature 134 and third dielectric layer 132 is formed over second dielectric layer 122. The material and the manufacturing process of third capping layer 130 and third dielectric layer 132 in interconnection structure 400 may be similar to the material and the manufacturing process of third capping layer 130 and third dielectric layer 132 in interconnection structure 200 described above.

Figure 6A:
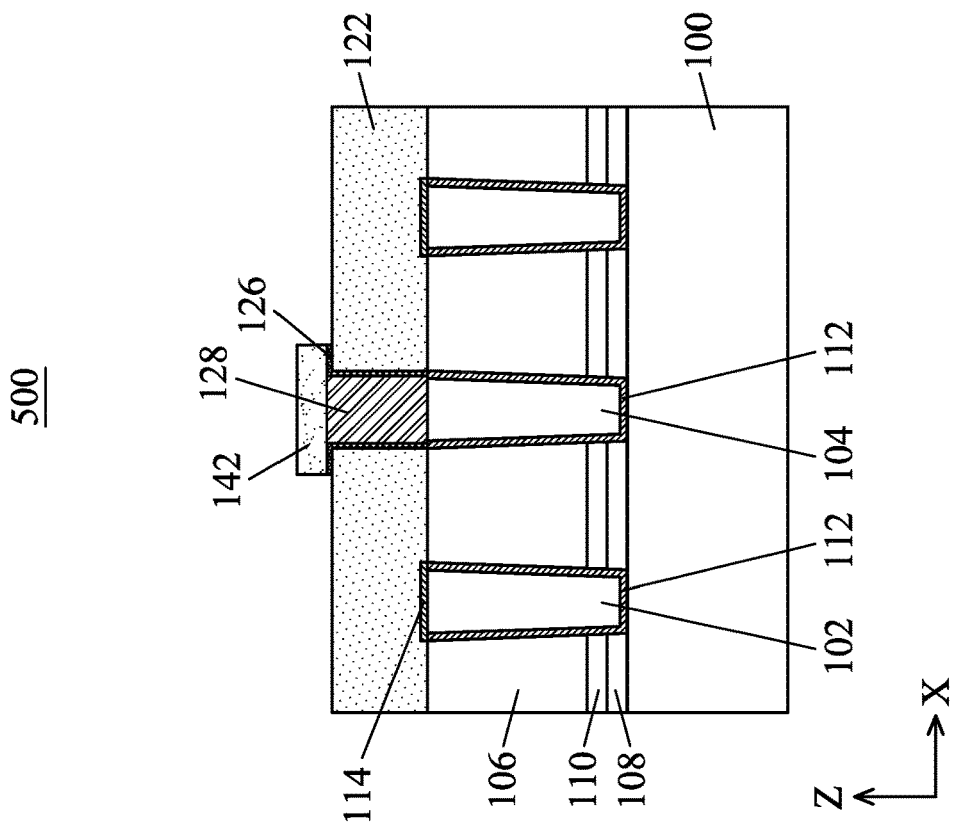
FIGS. 6A-6C are cross-sectional side views of various stages of manufacturing a further semiconductor interconnection structure, in accordance with some embodiments.
Figure 6B:
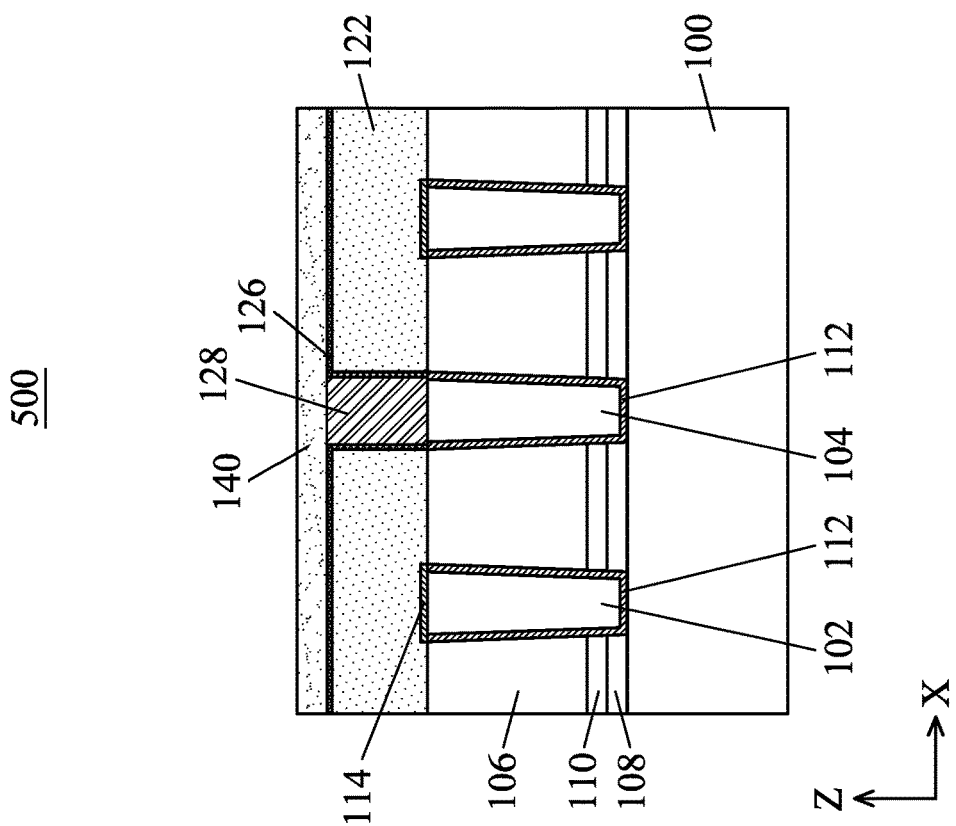
Figure 6C:
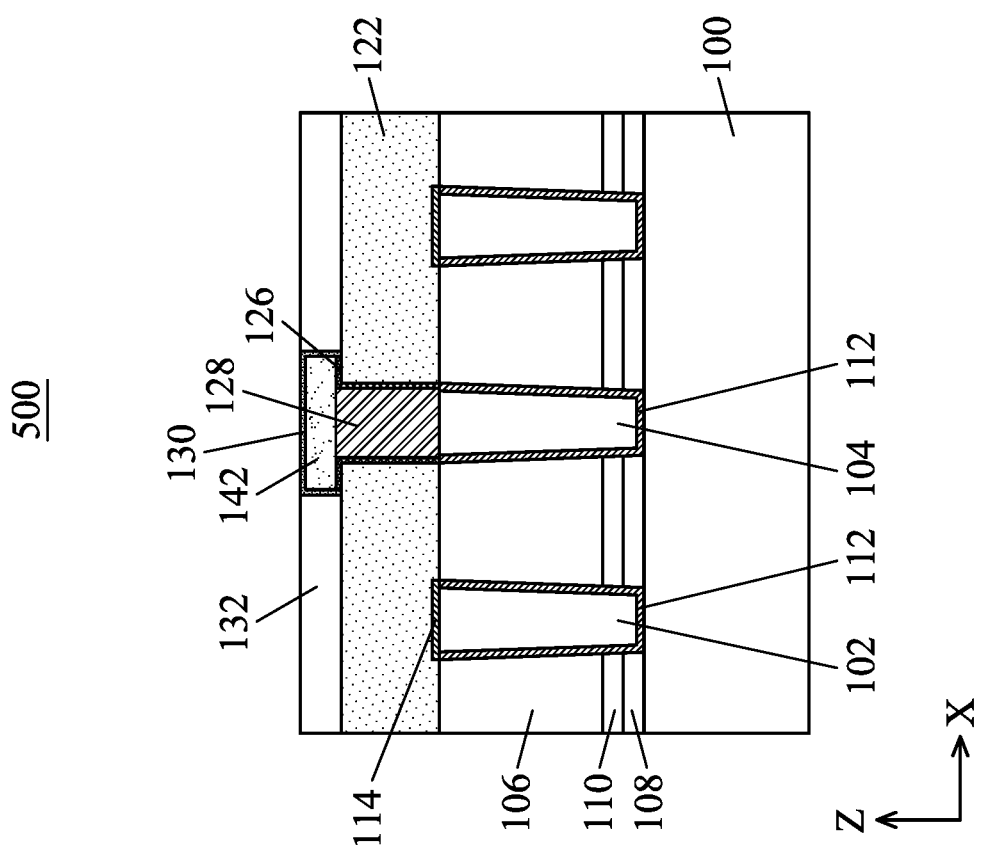

FIGS. 6A-6C are cross-sectional side views of various stages of manufacturing a further interconnection structure 500, in accordance with some embodiments. Interconnection structure 500, which is similar to interconnection structure 400, starts at a stage before forming conductive feature 134 as shown in FIGS. 5A-5B. However, the structure and the manufacturing process of conductive feature 134 of interconnection structure 400 is different from interconnection structure 500.

As shown in FIG. 6A, first conductive layer 128 is formed in opening 124 and second conductive layer 140 is formed on first conductive layer 128 and over liner layer 126. In some embodiments, first conductive layer 128 may include Ru, Mo, related alloys, or other suitable materials, and second conductive layer 140 may include Cu, Ni, Co, Ru, Ir, Al, Pt, Pd, Au, Ag, Os, W, Mo, related alloys, or other suitable materials. In some embodiments, first conductive layer 128 may be formed in the temperature between 425 degrees Celsius and 150 degrees Celsius by CVD, PVD, ALD or other suitable processes, and second conductive layer 140 may be formed in the temperature between 425 degrees Celsius and 150 degrees Celsius by ALD, CVD, PVD, ELD, ECP or other suitable processes.

As shown in FIG. 6B, portions of second conductive layer 140 are removed to form conductive feature 142 on conductive feature 104. Conductive feature 142 includes a via structure formed by first conductive layer 128 and a conductive line formed by second conductive layer 140. Then, as shown in FIG. 6C, third capping layer 130 is formed over conductive feature 142 and third dielectric layer 132 is formed over second dielectric layer 122 in a similar fashion as discussed above with respect to FIG. 4C.

FIGS. 7A-7D are cross-sectional side views of various stages of manufacturing a further interconnection structure 600, in accordance with some embodiments. Interconnection structure 600, which is similar to interconnection structure 200, starts at a stage after first capping layer 114 as shown in FIGS. 3A-3B is formed. After forming first capping layer 114, interconnection structure 600 does not include second capping layer 120 of interconnection structure 200. Furthermore, a fourth capping layer 150 is formed on top surfaces of conductive feature 102 and conductive feature 104, and the materials of fourth capping layer 150 may be different from the materials of first capping layer 114. In interconnection structure 600, fourth capping layer 150 is formed on top surfaces of conductive feature 102 and conductive feature 104. In some embodiments, fourth capping layer 150 may include a two-dimensional (2D) material. The term "2D material" used in this disclosure refers to single layer material or monolayer-type material that is atomically thin crystalline solid having intralayer covalent bonding and interlayer van der Waals bonding. Examples of a 2D material may include graphene, hexagonal boron nitride (h-BN), or transition metal dichalcogenides ($MX_2$), where M is a transition metal element and X is a chalcogenide element. Some exemplary $MX_2$ materials may include, but are not limited to $Hf$, $Te_2$, $WS_2$, $MoS_2$, $WSe_2$, $MoSe_2$, or any combination thereof. In some embodiments, fourth capping layer 150 may include graphene. In some embodiments, fourth capping layer 150 may be formed in the temperature between 450 degrees Celsius and 150 degrees Celsius by ALD or other suitable processes. In some embodiments, fourth capping layer 150 may prevent the metal diffusion from conductive feature 102 to second dielectric layer 122.

In some embodiments, second dielectric layer 122 may include SiOx, SiOxCyHz, SiOxCy, SiCx, or related low-k materials with ordered pores. The k value of second dielectric layer 122 may be in the range between 1.0-3.0. In some embodiments, second dielectric layer 122 may be formed in the temperature between 425 degrees Celsius and 150 degrees Celsius by CVD, PVD, ALD, spin coating, or other suitable processes. In some embodiments, second dielectric layer 122 may be formed with or without additional anneal or UV curing process. In some embodiments, first dielectric layer 106 and second dielectric layer 122 may be formed by the same material.

Figure 7A:
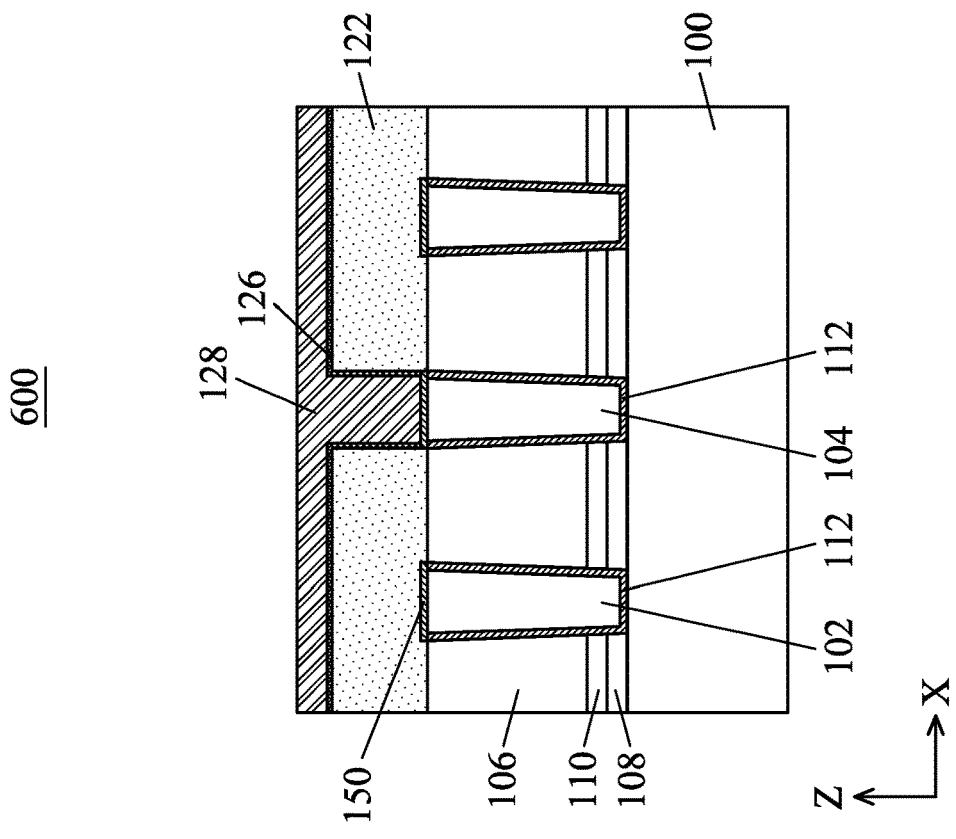
FIGS. 7A-7D are cross-sectional side views of various stages of manufacturing a further semiconductor interconnection structure, in accordance with some embodiments.

As shown in FIG. 7A, a portion of second dielectric layer 122 is removed to form opening 124 in second dielectric layer 122 exposing fourth capping layer 150 above conductive feature 104. Liner layer 126 is formed on sidewalls of opening 124 and on second dielectric layer 122. Since fourth capping layer 150 is formed by the 2D material and the 2D material (e.g., graphene) has a low contact resistance, fourth capping layer 150 above conductive feature 104 does not need to be removed when forming opening 124. In some embodiments, opening 124 may be formed by dry etch, wet etch or other suitable processes. In some embodiments, liner layer 126 may include HfOx or other suitable materials. In some embodiments, liner layer 126 may be formed in the temperature between 450 degrees Celsius and 150 degrees Celsius by CVD, PVD, ALD or other suitable processes.

Before forming liner layer 126, a pre-treatment process, such as a $H_2$ plasma treatment discussed above, may be performed on second dielectric layer 122 and fourth capping layer 150. The pre-treatment process may be performed by exposing the interconnection structure 600 to a $H_2$ plasma formed from hydrogen-containing precursor, such as hydrogen, ammonia, hydrocarbons, or the like, or any combination thereof. For example, the H2 plasma may change the surface functionalities of fourth capping layer 150 by reducing the number of unwanted hydroxyl groups on the graphene surface and providing strong chemical modification of the graphene via surface hydrogenation. The treated graphene surface hydrophobicity leads to a delay in the nucleation of liner layer 126. For example, during the deposition of liner layer 126, HfOx may be easier to bond with second dielectric layer 122 than with the treated surface of graphene. Hence, the pre-treatment process can assist in selective deposition of liner layer 126 on second dielectric layer 122. By performing the $H_2$ plasma treatment, the surface of second dielectric layer 122, e.g., SiOx, SiOxCyHz, SiOxCy or SiCx, and fourth capping layer 150, e.g., 2D material, may have different deposition selectivity of liner layer 126, e.g., HfOx. Therefore, liner layer 126 is formed on sidewalls of opening 124 and on second dielectric layer 122, but not formed on fourth capping layer 150, as shown in FIG. 7A.

Figure 7B:
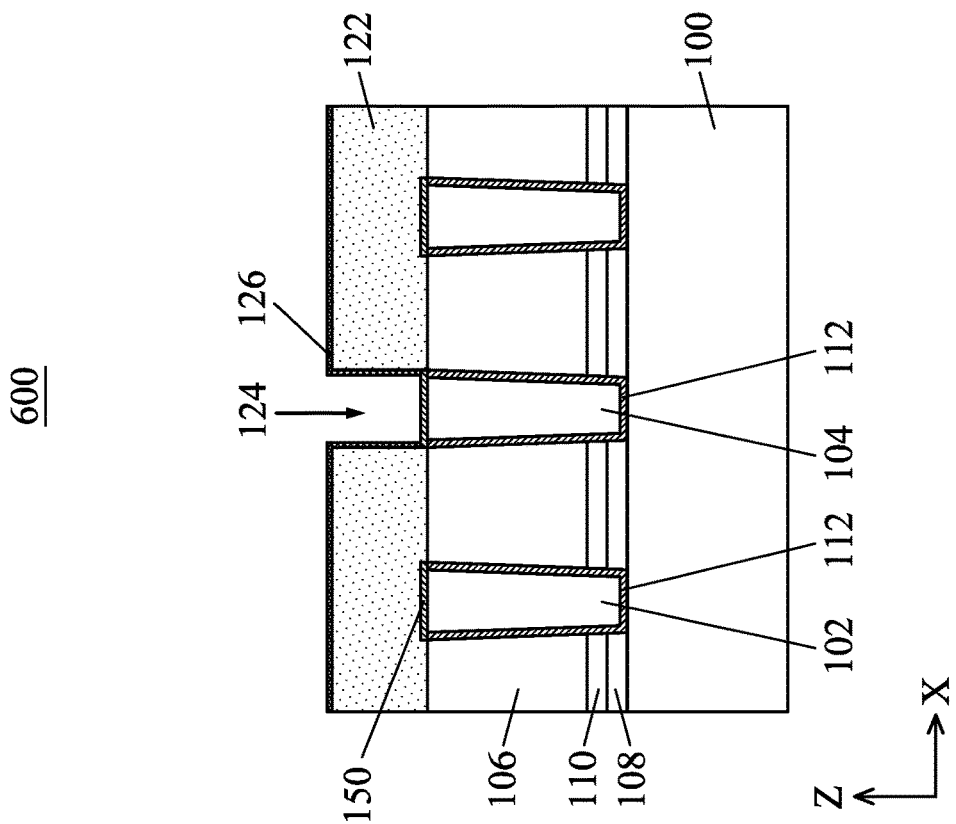

As shown in FIG. 7B, first conductive layer 128 is formed in opening 124 and over fourth capping layer 150 and liner layer 126. In some embodiments, first conductive layer 128 may include Ru, Mo, related alloys, or other suitable materials. In some embodiments, first conductive layer 128 may be formed in the temperature between 425 degrees Celsius and 150 degrees Celsius by CVD, PVD, ALD or other suitable processes. Then, as shown in FIG. 7C, portions of first conductive layer 128 are removed to form conductive feature 134 on fourth capping layer 150 and conductive feature 104.

In some embodiments, conductive feature 134 may be formed by dual damascene, single damascene, semi damascene, or other suitable processes. In some embodiments, conductive feature 134 may be formed by semi damascene process. In some embodiments, second dielectric layer 122 is patterned to form opening 124 and opening 124 is then filled with first conductive layer 128, e.g., Ru. First conductive layer 128 is overfilled in opening 124 and on second dielectric layer 122, which means the deposition of first conductive layer 128 continues until a layer of first conductive layer 128 is formed over second dielectric layer 122. Then, first conductive layer 128 is masked and etched to form conductive feature 134. Conductive feature 134 may include a via structure in opening 124 and a conductive line on the via structure. In some embodiments, the via structure and the conductive line may be formed by the same material, as shown in FIG. 7C.

Figure 7D:
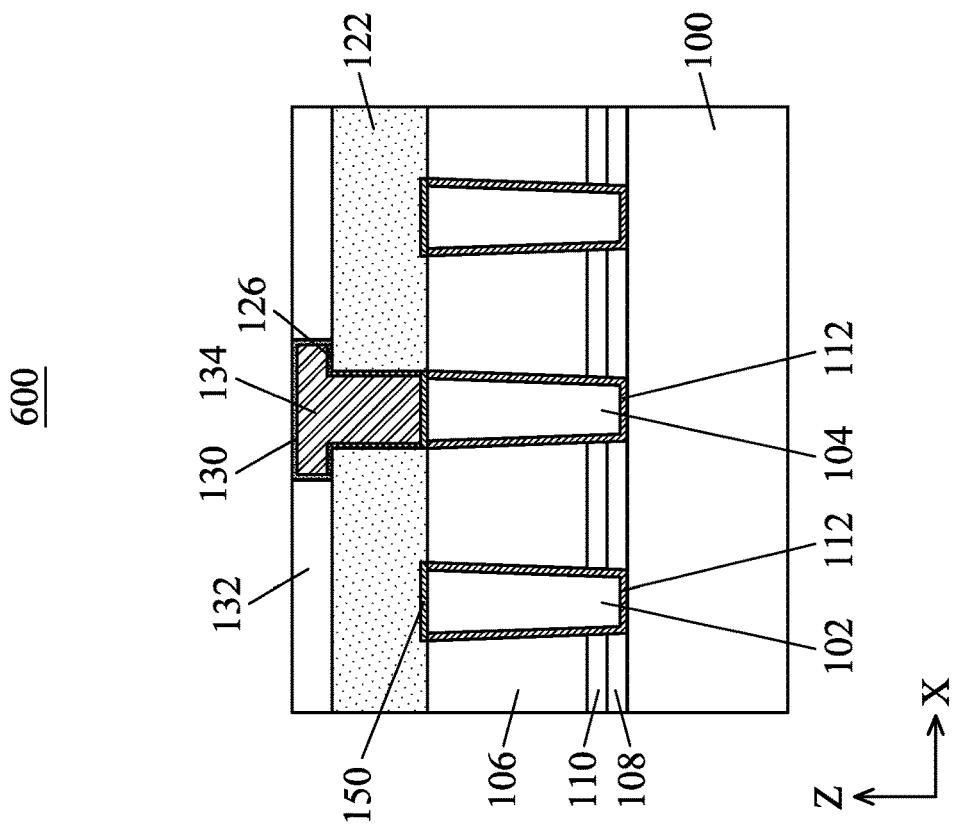
Figure 7C:
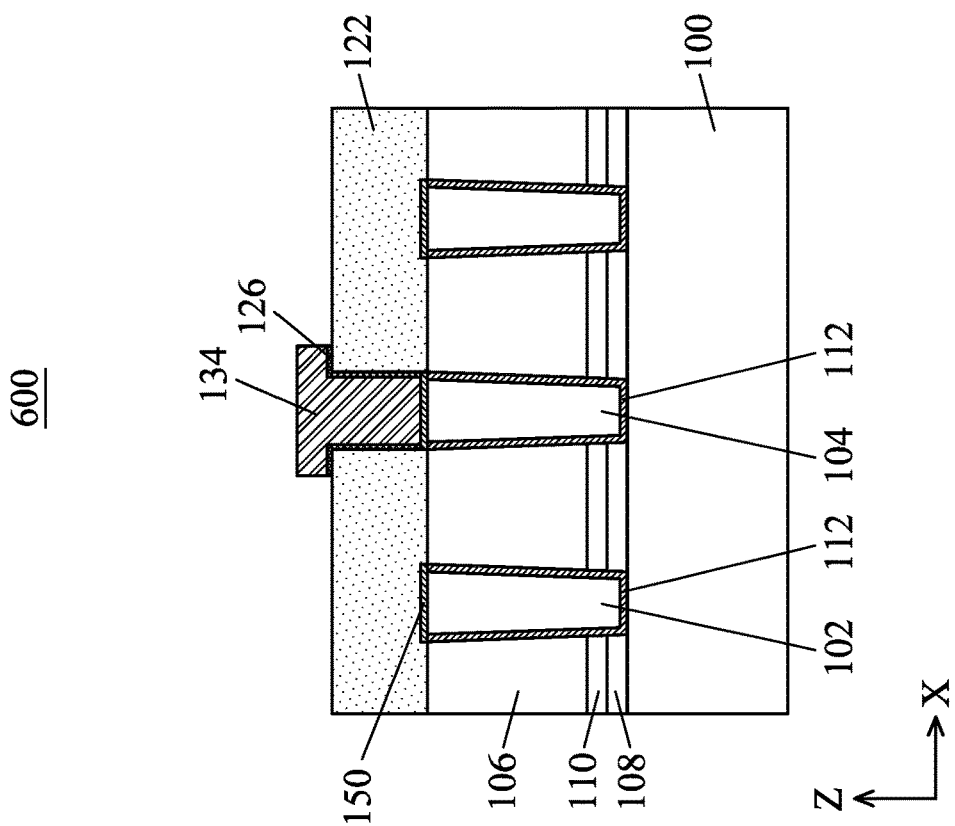

As shown in FIG. 7D, third capping layer 130 is formed over conductive feature 134 and third dielectric layer 132 is formed over second dielectric layer 122. In some embodiments, third capping layer 130 may include SiOxCyHz, SiOxCy, SiCx, SiNx, SiCxNy, or other suitable materials. In some embodiments, third capping layer 130 may be formed in the temperature between 450 degrees Celsius and 150 degrees Celsius by CVD, PVD, ALD or other suitable processes. In some embodiments, third dielectric layer 132 may include SiOx, SiOxCyHz, SiOxCy, SiCx, or related low-k materials with or without ordered pores. The k value of third dielectric layer 132 may be in the range between 1.0-5.0. In some embodiments, third dielectric layer 132 may be formed in the temperature between 425 degrees Celsius and 150 degrees Celsius by CVD, PVD, ALD, spin coating, or other suitable processes. In some embodiments, third dielectric layer 132 may be formed with or without additional anneal or UV curing process. In some embodiments, third dielectric layer 132 and second dielectric layer 122 may be formed by the same material.

Figure 8B:
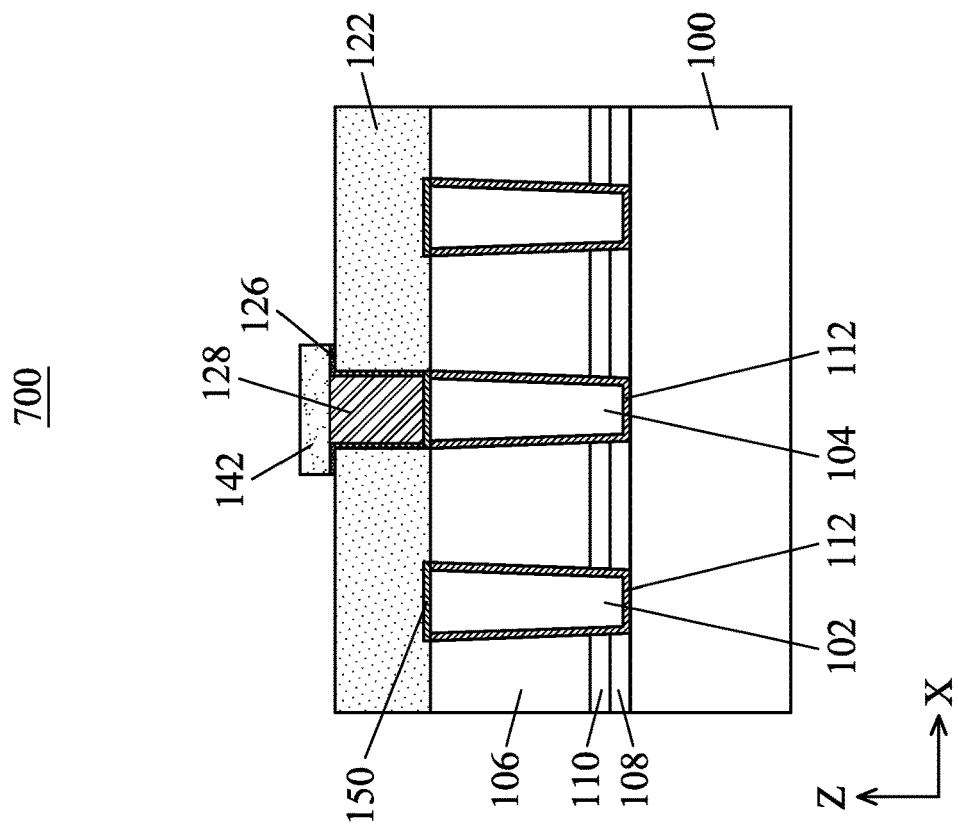
FIGS. 8A-8C are cross-sectional side views of various stages of manufacturing a further semiconductor interconnection structure, in accordance with some embodiments.
Figure 8A:
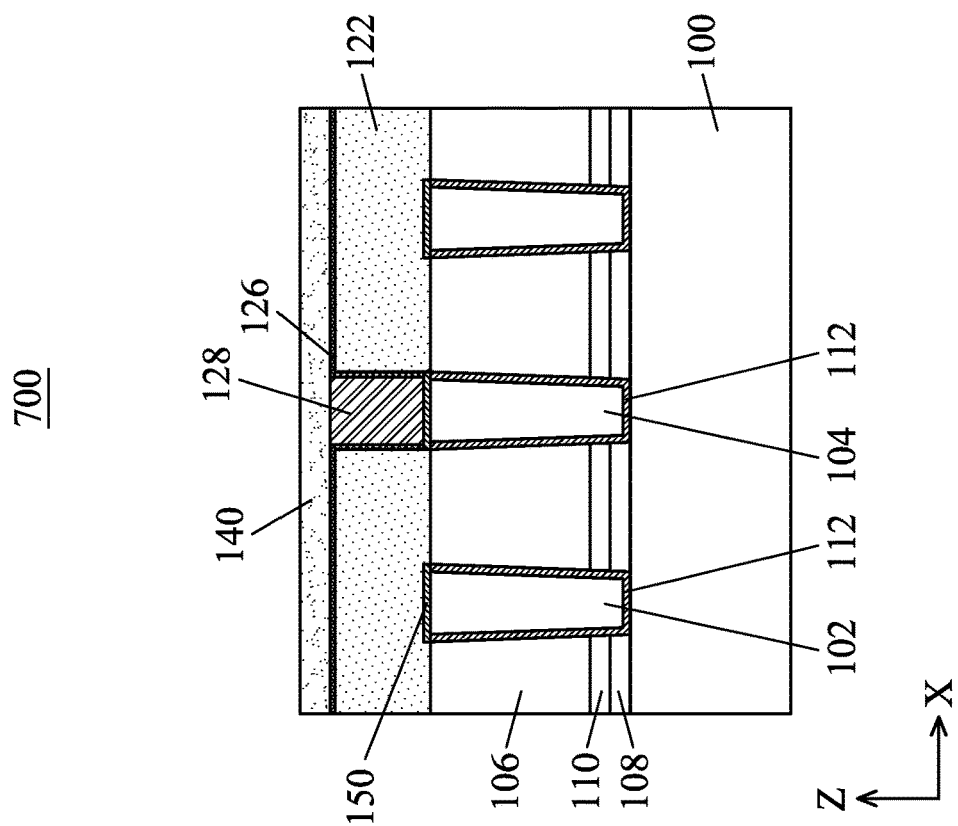
Figure 8C:
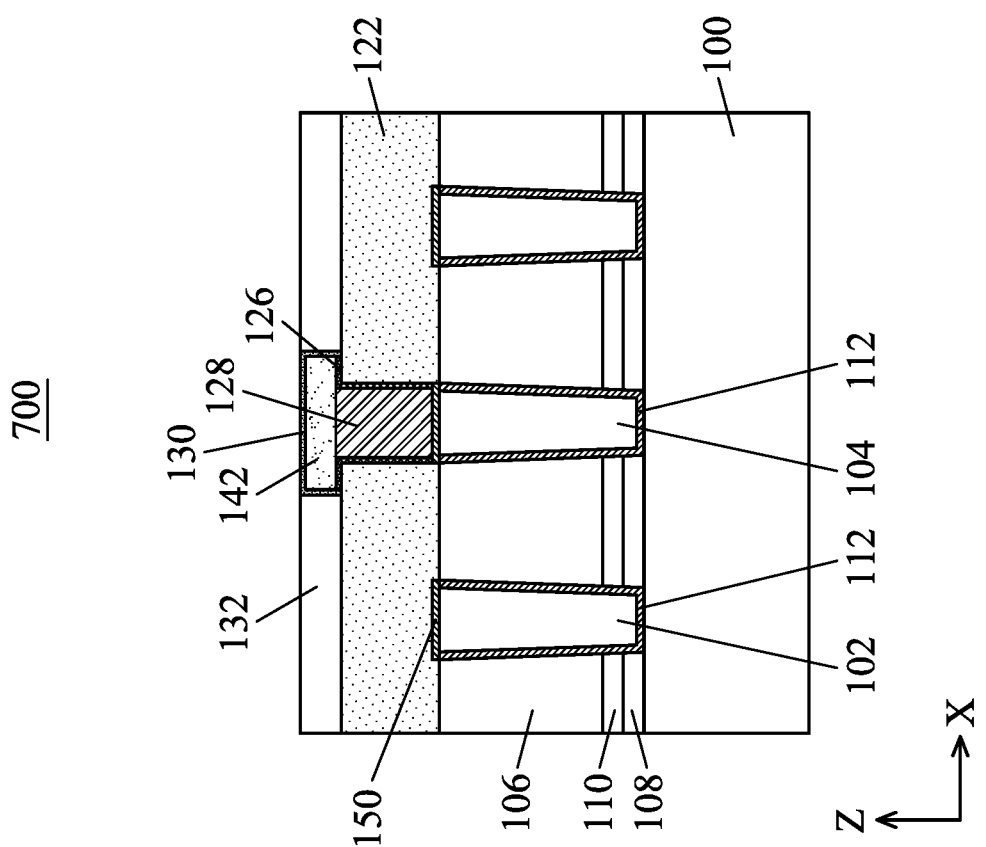

FIGS. 8A-8C are cross-sectional side views of various stages of manufacturing a further interconnection structure 700, in accordance with some embodiments. Interconnection structure 700 is similar to interconnection structure 600 before forming conductive feature 134 as shown in FIGS. 7A-7B. However, the structure and the manufacturing process of conductive feature 134 of interconnection structure 600 is different from interconnection structure 700.

As shown in FIG. 8A, first conductive layer 128 is formed in opening 124 over fourth capping layer 150 and second conductive layer 140 is formed on first conductive layer 128 and over liner layer 126. In some embodiments, first conductive layer 128 may include Ru, Mo, related alloys, or other suitable materials, and second conductive layer 140 may include Cu, Ni, Co, Ru, Ir, Al, Pt, Pd, Au, Ag, Os, W, Mo, related alloys, or other suitable materials. In some embodiments, first conductive layer 128 may be formed in the temperature lower than 425 degrees Celsius by CVD, PVD, ALD or other suitable processes, and second conductive layer 140 may be formed in the temperature between 425 degrees Celsius and 150 degrees Celsius by ALD, CVD, PVD, ELD, ECP or other suitable processes.

As shown in FIG. 8B, portions of second conductive layer 140 are removed to form conductive feature 142 on conductive feature 104. Conductive feature 142 includes a via structure formed by first conductive layer 128 and a conductive line formed by second conductive layer 140. Then, as shown in FIG. 8C, third capping layer 130 is formed over conductive feature 142 and third dielectric layer 132 is formed over second dielectric layer 122.

By forming conductive feature 134 on conductive feature 104 with the operations described above, a self-aligned interconnection structure can be formed without using SAM process. By forming conductive feature 134 on conductive feature 104 with the operations described above without SAM process, the issues (e.g., SAM residues remain on metal lines and/or unwanted reaction between SAM and subsequent deposition precursor) of using SAM process to form the self-aligned interconnection structure can be avoided, the reliability of the self-aligned interconnection structure can be improved, and the resistance of the interconnection structure can be reduced.

In addition, the self-aligned interconnection structure is achieved by performing the substrate modification, e.g., the $H_2$ plasma treatment, before the selective deposition. The plasma treatment can improve the selectivity of the selective deposition to perform the self-alignment patterning operations. Furthermore, there is no ESL needed between first dielectric layer 106 and second dielectric layer 122. In other words, first dielectric layer 106 is in direct contact with second dielectric layer 122. Since ESL has high dielectric constant, the interconnection structure without ESL can lower the capacitance.

Furthermore, first dielectric layer 106 and second dielectric layer 122 may include or be made of dielectric materials with ordered pores that have the characteristics of low dielectric constant and high mechanical strength. Hence, the k-value of first dielectric layer 106 and second dielectric layer 122 can be reduced, and the interconnection structure can also lower the capacitance.

Interconnection structure 600 or 700 has a further advantage by using the 2D material to form the capping layer between the conductive features. The 2D material, fourth capping layer 150, has a great barrier characteristic to prevent the metal diffusion from conductive feature 102 to second dielectric layer 122. Since the 2D material also has a characteristic of low resistance, fourth capping layer 150 between conductive feature 104 and first conductive layer 128 does not need to be removed. As a result, the process of forming the interconnection structure can be further simplified.

An embodiment is an interconnection structure. The interconnection structure includes a first dielectric layer, a first conductive feature, a second dielectric layer, a conductive layer, a liner layer, a third dielectric layer, a second conductive feature, and a first capping layer. The first conductive feature is disposed in the first dielectric layer. The second dielectric layer is formed on the first dielectric layer, and the second dielectric layer is in direct contact with the first dielectric layer. The conductive layer is disposed in the second dielectric layer. The liner layer is disposed between the conductive layer and the second dielectric layer. The third dielectric layer is formed on the second dielectric layer. The second conductive feature is disposed in the third dielectric layer. The first capping layer is disposed between the second conductive feature and the third dielectric layer.

Another embodiment is an interconnection structure. The interconnection structure includes a first dielectric layer, a first conductive feature, a second dielectric layer, a conductive layer, a liner layer, a first capping layer, a third dielectric layer, a second conductive feature, and a second capping layer. The first conductive feature is disposed in the first dielectric layer. The second dielectric layer is formed on the first dielectric layer. The conductive layer is disposed in the second dielectric layer. The liner layer is disposed between the conductive layer and the second dielectric layer. The first capping layer is disposed between the first conductive feature and the conductive layer, and the first capping layer includes a 2D material. The third dielectric layer is formed on the second dielectric layer. The second conductive feature is disposed in the third dielectric layer. The second capping layer is disposed between the second conductive feature and the third dielectric layer.

A further embodiment is a method for forming an interconnection structure. A first conductive feature and a second conductive feature are formed in a first dielectric layer. A first capping layer is formed on top surfaces of the first conductive feature and the second conductive feature. A second dielectric layer is formed over the first dielectric layer and the first capping layer. A portion of the second dielectric layer is removed to form a first opening in the second dielectric layer exposing the first capping layer above the first conductive feature. A first conductive layer is formed in the first opening. A third conductive feature is formed on the first conductive feature.

A further embodiment is a method for forming an interconnection structure. A first conductive feature and a second conductive feature are formed in a first dielectric layer. A first capping layer is formed on top surfaces of the first conductive feature and the second conductive feature. A sacrificial layer is formed over the first dielectric layer, and the first capping layer. A first opening is formed in the sacrificial layer to expose first capping layer above the second conductive feature. A pre-treatment operation is performed on the sacrificial layer. A second capping layer is formed on the exposed first capping layer above the second conductive feature. The sacrificial layer is removed. A second dielectric layer is formed over the first dielectric layer, the first capping layer and the second capping layer. A portion of the second dielectric layer is removed to form a second opening in the second dielectric layer exposing the first capping layer above the first conductive feature. A first conductive layer is formed in the second opening. A third conductive feature is formed on the first conductive feature.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. An interconnection structure, comprising:
   a first dielectric layer;
   a first conductive feature disposed in the first dielectric layer;
   a second dielectric layer on the first dielectric layer, wherein the second dielectric layer is in direct contact with the first dielectric layer;
   a conductive layer disposed in the second dielectric layer and in direct contact with the first conductive feature;
   a liner layer disposed between the conductive layer and the second dielectric layer, the liner layer having a portion extended over to a top surface of the second dielectric layer;
   a third dielectric layer on and in direct contact with the second dielectric layer;
   a second conductive feature disposed in the third dielectric layer, the second conductive feature having a portion in direct contact with the conductive layer, and a portion of the liner layer is disposed between and in contact with the second conductive feature and the second dielectric layer; and
   a first capping layer disposed between the second conductive feature and the third dielectric layer, and a portion of the first capping layer being extended to cover a top surface of the second conductive feature.

2. The interconnection structure of claim 1, wherein the conductive layer and the second conductive feature comprise a same material.

3. The interconnection structure of claim 1, wherein second dielectric layer comprises a dielectric material with ordered pores.

4. The interconnection structure of claim 1, wherein first capping layer covers exposed surfaces of the liner layer and the second conductive feature.

5. The interconnection structure of claim 1, further comprising:
   a third conductive feature disposed in the first dielectric layer; and
   a second capping layer disposed on the third conductive feature.

6. The interconnection structure of claim 5, further comprising:
   a third capping layer disposed on the second capping layer.

7. The interconnection structure of claim 6, wherein the first capping layer comprises a material different than that of the third capping layer, and the second capping layer comprises a material different than that of the third capping layer.

8. An interconnection structure, comprising:
   a first dielectric layer;
   a first conductive feature disposed in the first dielectric layer;
   a second dielectric layer on the first dielectric layer;
   a conductive layer disposed in the second dielectric layer;
   a liner layer disposed between the conductive layer and the second dielectric layer;
   a first capping layer disposed between and in contact with the first conductive feature and the conductive layer, wherein the first capping layer comprises a two-dimensional (2D) material, and a portion of the first capping layer is in contact with a bottom of the liner layer and the second dielectric layer;
   a third dielectric layer on the second dielectric layer;
   a second conductive feature disposed in the third dielectric layer; and
   a second capping layer disposed between and in direct contact with the second conductive feature and the third dielectric layer.

9. The interconnection structure of claim 8, wherein the first capping layer comprises graphene.

10. The interconnection structure of claim 8, wherein the liner layer is further disposed between the second conductive feature and the second dielectric layer.

11. The interconnection structure of claim 10, wherein the second capping layer covers exposed surfaces of the liner layer and the second conductive feature.

12. The interconnection structure of claim 11, wherein the second capping layer is further in contact with the second dielectric layer.

13. The interconnection structure of claim 8, wherein the conductive layer and the second conductive feature comprise a same material.

14. The interconnection structure of claim 8, wherein the second dielectric layer comprises a dielectric material with ordered pores.

15. The interconnection structure of claim 14, wherein the third dielectric layer comprises a dielectric material with or without ordered pores.

16. A method for forming an interconnection structure, comprising:
   forming a first conductive feature and a second conductive feature in a first dielectric layer;
   forming a first capping layer on top surfaces of the first conductive feature and the second conductive feature;
   forming a sacrificial layer over the first dielectric layer and the first capping layer;
   removing a portion of the sacrificial layer to form a first opening in the sacrificial layer exposing the first capping layer above the second conductive feature;
   after forming the first opening, forming a second capping layer on the first capping layer above the second conductive feature;
   removing the sacrificial layer;
   forming a second dielectric layer over the first dielectric layer, the second dielectric layer covering exposed surfaces of the first and second capping layers;
   removing a portion of the second dielectric layer and the first capping layer to form a second opening in the second dielectric layer exposing entire top surface of the first conductive feature;

forming a liner layer on sidewalls of the second opening and on a top surface of the second dielectric layer; and forming a first conductive layer on the liner layer in the second opening and over the top surface of the first conductive feature, a bottom of the first conductive layer being in direct contact with the entire top surface of the first conductive feature.

17. The method of claim 16, further comprising:

patterning the first conductive layer and the liner layer over the top surface of the second dielectric layer.

18. The method of claim 17, further comprising:

forming a third capping layer on exposed surfaces of the first conductive layer and the liner layer;

forming a third dielectric layer on the second dielectric layer and over exposed surfaces of the third capping layer; and performing a planarization operation so that a top surface of the third capping layer and a top surface of the third dielectric layer are substantially co-planar.

19. The method of claim 16, further comprising:

performing a planarization operation to remove a portion of the first conductive layer so that a top surface of the first conductive layer and a top surface of the liner layer over the second dielectric layer are substantially co-planar;

forming a second conductive layer on the top surface of the first conductive layer and the top surface of the liner layer over the second dielectric layer; and patterning the second conductive layer and the liner layer over the second dielectric layer to form a third conductive feature.

20. The method of claim 19, wherein the first conductive layer and the second conductive layer comprise a different material.

* * * * *